(12) United States Patent
Van Dal et al.

(10) Patent No.: US 10,680,062 B2
(45) Date of Patent: Jun. 9, 2020

(54) III-V SEMICONDUCTOR LAYERS, III-V SEMICONDUCTOR DEVICE AND METHODS OF MANUFACTURING THEREOF

(71) Applicant: TAIWAN SEMICONDUCTOR MANUFACTURING CO., LTD., Hsinchu (TW)

(72) Inventors: Mark Van Dal, Linden (BE); Gerben Doornbos, Kessel-Lo (BE); Matthias Passlack, Huldenberg (BE); Martin Christopher Holland, Bertem (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/383,528

(22) Filed: Apr. 12, 2019

(65) Prior Publication Data

US 2019/0245037 A1    Aug. 8, 2019

Related U.S. Application Data

(62) Division of application No. 15/397,508, filed on Jan. 3, 2017, now Pat. No. 10,263,073.

(Continued)

(51) Int. Cl.
*H01L 29/423* (2006.01)
*H01L 29/06* (2006.01)

(Continued)

(52) U.S. Cl.
CPC .......... *H01L 29/0673* (2013.01); *B82Y 10/00* (2013.01); *H01L 21/30604* (2013.01); *H01L 29/0649* (2013.01); *H01L 29/1079* (2013.01); *H01L 29/20* (2013.01); *H01L 29/42364* (2013.01); *H01L 29/42376* (2013.01); *H01L 29/6656* (2013.01); *H01L 29/66469* (2013.01); *H01L 29/66522* (2013.01); *H01L 29/66545* (2013.01); *H01L 29/66742* (2013.01); *H01L 29/775* (2013.01); *H01L 29/7853* (2013.01);

(Continued)

(58) Field of Classification Search
CPC ............. H01L 29/0649; H01L 29/0673; H01L 29/42376; H01L 29/66469; H01L 29/66522; H01L 29/66545; H01L 29/66795; H01L 29/775; H01L 29/7853; H01L 29/7854; H01L 29/7856
See application file for complete search history.

(56) References Cited

U.S. PATENT DOCUMENTS 9,425,291 B1    8/2016   Balakrishnan et al.
9,876,088 B1    1/2018   Van Dal et al.
(Continued)

OTHER PUBLICATIONS

Office Action issued in related U.S. Appl. No. 15/397,508, dated Apr. 16, 2018.
(Continued)

*Primary Examiner* — Stephen W Smoot
(74) *Attorney, Agent, or Firm* — McDermott Will & Emery LLP

(57) ABSTRACT

A gate-all-around field effect transistor (GAA FET) includes an InAs nano-wire as a channel layer, a gate dielectric layer wrapping the InAs nano-wire, and a gate electrode metal layer formed on the gate dielectric layer. The InAs nano-wire has first to fourth major surfaces three convex-rounded corner surfaces and one concave-rounded corner surface.

20 Claims, 17 Drawing Sheets

Related U.S. Application Data

(60) Provisional application No. 62/427,591, filed on Nov. 29, 2016.

(51) Int. Cl.
    *H01L 29/78*     (2006.01)
    *H01L 29/66*     (2006.01)
    *H01L 29/775*    (2006.01)
    *H01L 29/20*     (2006.01)
    *B82Y 10/00*     (2011.01)
    *H01L 29/10*     (2006.01)
    *H01L 21/306*    (2006.01)
    *H01L 29/04*     (2006.01)

(52) U.S. Cl.
    CPC ........ *H01L 29/7854* (2013.01); *H01L 29/045* (2013.01); *H01L 29/66439* (2013.01)

(56) References Cited

U.S. PATENT DOCUMENTS

| | | |
|---|---|---|
| 2008/0030838 A1 | 2/2008 | Moselund et al. |
| 2010/0187503 A1 | 7/2010 | Moriyama et al. |
| 2011/0073842 A1 | 3/2011 | Liu et al. |
| 2016/0268382 A1 | 9/2016 | Colinge et al. |
| 2017/0117359 A1 | 4/2017 | Cheng et al. |

OTHER PUBLICATIONS

Office Action issued in related U.S. Appl. No. 15/397,508, dated Jul. 26, 2018.
Notice of Allowance issued in related U.S. Appl. No. 15/397,508, dated Dec. 5, 2018.

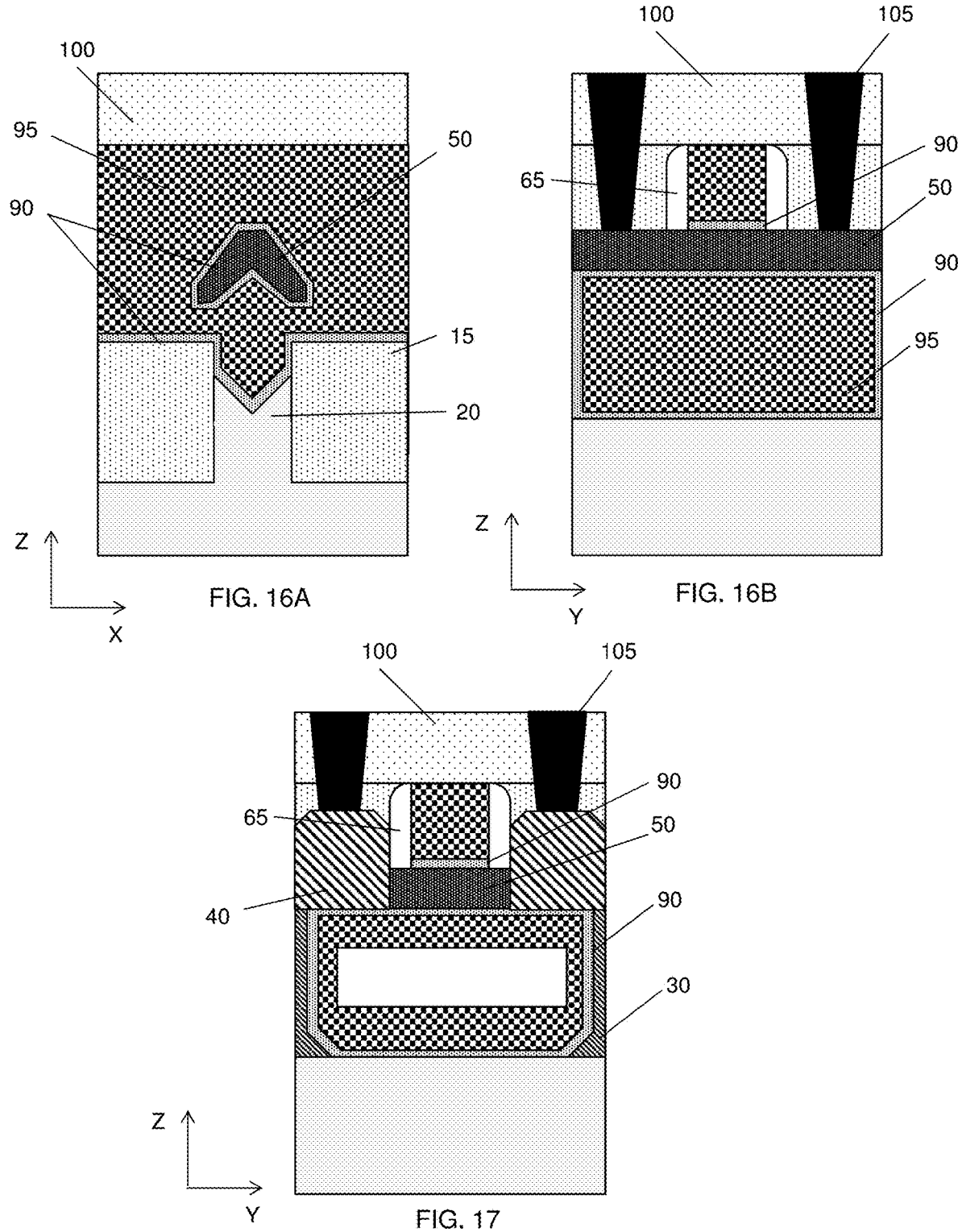

III-V SEMICONDUCTOR LAYERS, III-V SEMICONDUCTOR DEVICE AND METHODS OF MANUFACTURING THEREOF

CROSS-REFERENCE TO RELATED APPLICATIONS

This application is a divisional application of application Ser. No. 15/397,508 filed Jan. 3, 2017, now U.S. Pat. No. 10,263,073, which claims priority to U.S. Provisional Patent Application 62/427,591 filed Nov. 29, 2016, the entire disclosure of each of which is incorporated herein by reference.

TECHNICAL FIELD

This disclosure relates to Group III-V (III-V) semiconductor layers, III-V semiconductor devices, such as gate-all-around (GAA) field effect transistors (FETs), and methods of manufacturing the same. More particularly, this disclosure describes device quality III-V semiconductor layers directly grown on a silicon substrate for use in electronic, optical, optoelectronic, and magnetic devices.

BACKGROUND

The integration of Group III-V semiconductors on a silicon (Si) substrate has been an active field of research for more than 30 years. Various approaches including growth of buffer layers to accommodate the lattice mismatch between the Si substrate and the III-V layer, Si-on-insulator (SOI), epitaxial transfer methods, epitaxial lateral overgrowth, selective epitaxy on patterned substrates, and aspect-ratio-trapping (ART) techniques have been investigated. However, significant levels of defects, high cost, and complex integration schemes have hampered large scale commercial impact.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4A corresponds to the cross sectional view along X-X of FIG. 1B, and FIG. 4B corresponds to the cross sectional view along Y-Y of FIG. 1B.

FIG. 5A corresponds to the cross sectional view along X-X of FIG. 1B, and FIG. 5B corresponds to the cross sectional view along Y-Y of FIG. 1B.

FIG. 6A corresponds to the cross sectional view along X-X of FIG. 1B, and FIG. 6B corresponds to the cross sectional view along Y-Y of FIG. 1B.

FIG. 7A corresponds to the cross sectional view along X-X of FIG. 1B, and FIG. 7B corresponds to the cross sectional view along Y-Y of FIG. 1B.

FIG. 8A corresponds to the cross sectional view along X-X of FIG. 1B, and FIG. 8B corresponds to the cross sectional view along Y-Y of FIG. 1B.

FIG. 9A corresponds to the cross sectional view along X-X of FIG. 1B, and FIG. 9B corresponds to the cross sectional view along Y-Y of FIG. 1B.

FIG. 10A corresponds to the cross sectional view along X-X of FIG. 1B, and FIG. 10B corresponds to the cross sectional view along Y-Y of FIG. 1B.

FIG. 11A corresponds to the cross sectional view along X-X of FIG. 1B, and FIG. 11B corresponds to the cross sectional view along Y-Y of FIG. 1B.

FIG. 12A corresponds to the cross sectional view along X-X of FIG. 1B, and FIG. 12B corresponds to the cross sectional view along Y-Y of FIG. 1B.

FIG. 13A corresponds to the cross sectional view along X-X of FIG. 1B, and FIG. 13B corresponds to the cross sectional view along Y-Y of FIG. 1B.

FIG. 14A corresponds to the cross sectional view along X-X of FIG. 1B, and FIG. 14B corresponds to the cross sectional view along Y-Y of FIG. 1B.

FIG. 15A corresponds to the cross sectional view along X-X of FIG. 1B, and FIG. 15B corresponds to the cross sectional view along Y-Y of FIG. 1B.

FIGS. 16A and 16B show exemplary cross sectional views of one of the various stages for manufacturing a III-V semiconductor FET device according to one embodiment of the present disclosure. FIG. 16A corresponds to the cross sectional view along X-X of FIG. 1B, and FIG. 16B corresponds to the cross sectional view along Y-Y of FIG. 1B.

FIG. 17 shows an exemplary cross sectional view of a III-V semiconductor FET device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." The order of the following operations can be changed. One or more additional operations may be performed during or after the following operations, and one or more of the following operations can be removed.

Figure 1A:
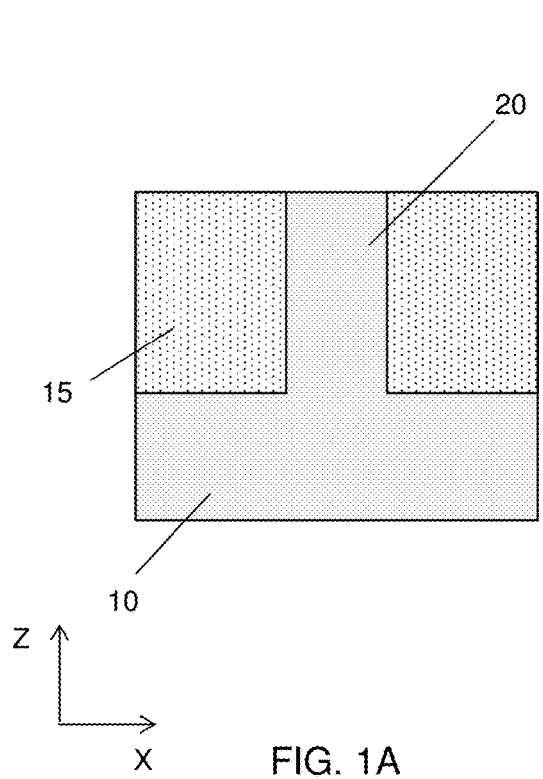
FIGS. 1A and 1B show exemplary views of one of the various stages for manufacturing a III-V semiconductor FET device according to one embodiment of the present disclosure
Figure 1B:
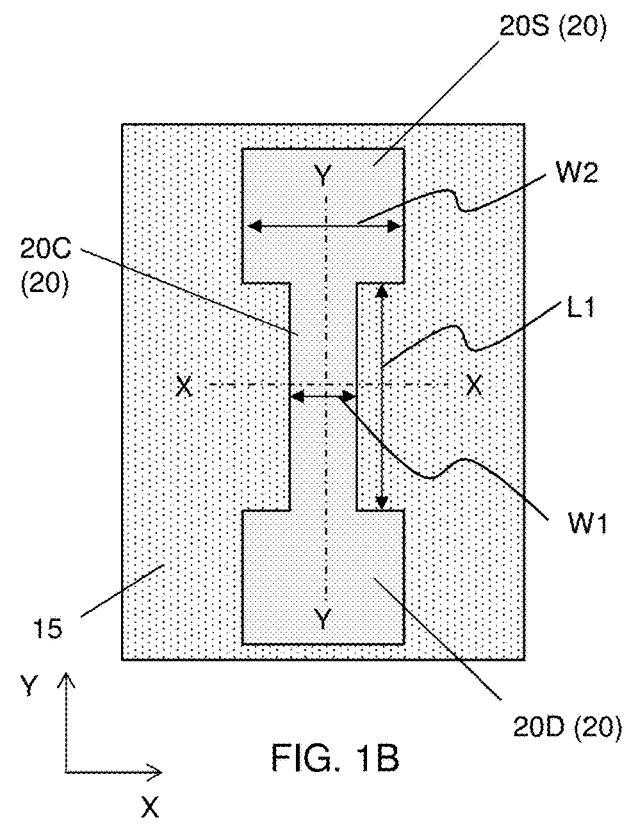

As shown in FIGS. 1A and 1B, an insulating layer, a shallow trench isolation (STI) 15 is formed in a substrate 10. The substrate 10 is a silicon (Si) substrate, such as a silicon wafer having a diameter of 150 mm, 200 mm or 300 mm, in some embodiments. A mask layer including a silicon oxide layer and a silicon nitride layer is formed on the substrate 10. After the mask layer is formed, the mask layer is patterned by lithography and etching operations. Then, by using the patterned mask layer as an etching mask, the substrate 10 is trench-etched to form trenches. A depth of the trenches is in a range from about 100 nm to about 1 µm in some embodiments. The trenches are filled with an insulating (dielectric) material 15. One or more layers of insulating materials such as silicon oxide, silicon oxynitride or silicon nitride, are formed by LPCVD (low pressure chemical vapor deposition), plasma-CVD or flowable CVD. The insulating material layer may be formed by one or more layers of spin-on-glass (SOG), SiO, SiON, SiOCN and/or fluorine-doped silicate glass (FSG). After forming the insulating material layer, a planarization operation including a chemical mechanical polishing (CMP) or an etch-back process, is performed so as to remove upper part of the insulating material layer, such that the STI 15 is formed, as shown in FIG. 1A. The substrate not etched, and surrounded or separated by the STI 15 in plan view is a Si region 20, as shown in FIG. 1B. Since the Si region has a narrow width, the Si region 20 may be referred to as a Si fin.

As shown in FIG. 1B, the Si region 20 has a for-channel region 20C, a for-source region 20S and a for-drain region 20D. The width W1 of the for-channel region 20C is in a range from about 5 nm to about 50 nm, in some embodiments, and is in a range from about 10 nm to about 20 nm in other embodiments. The length L1 of the for-channel region 20C is in a range from about 50 nm to about 200 nm in some embodiments, and is in a range from about 70 nm to about 120 nm in other embodiments. The width W2 of the for-source and for-drain regions 20S, 20D is equal to or greater than the width W1. The channel direction corresponds to the Y direction, which crosses the X direction (and the Z direction).

Figure 2:
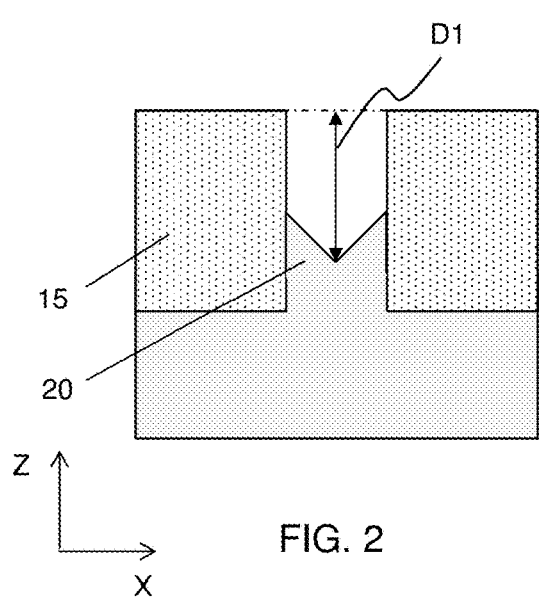
FIG. 2 shows an exemplary cross sectional view of one of the various stages for manufacturing a III-V semiconductor FET device according to one embodiment of the present disclosure.

After the STI 15 and the Si region 20 are formed, the Si region 20 is recessed (etched) down along the Z direction, as shown in FIG. 2. The Si region 20 can be selectively etched by using tetra methyl ammonium hydroxide (TMAH), in some embodiments. After the TMAH etching, the bottom of the recessed Si region 20 has a V-shape surface when a (100) Si substrate is used, due to the characteristics of anisotropic nature of TMAH etching characteristics of Si crystals. The etched amount D1 is in a range from about 20 nm to about 150 nm in some embodiments. In other embodiments, the Si region 20 can be selectively etched by using an HCl solution. In such a case, the etched surface of the Si region 20 has a substantially flat surface.

Figure 3:
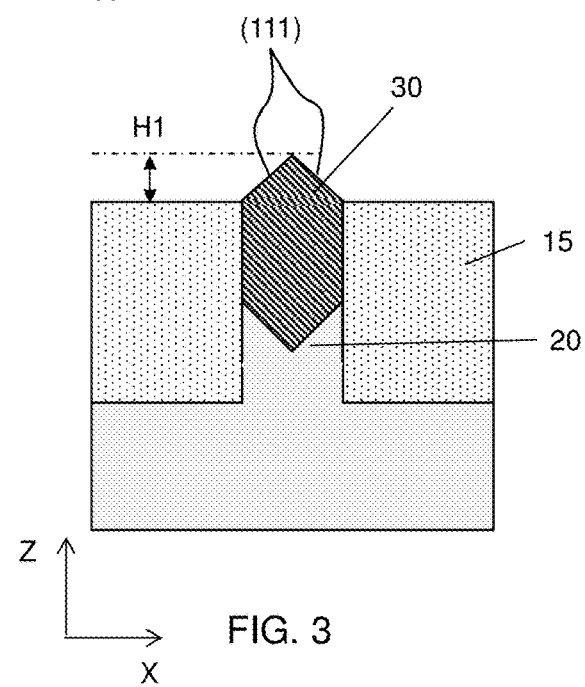
FIG. 3 shows an exemplary cross sectional view of one of the various stages for manufacturing a III-V semiconductor FET device according to one embodiment of the present disclosure.

After the Si region 20 is recessed, a compound semiconductor layer 30 is formed on the surface of the recessed Si region 20 as shown in FIG. 3. The compound semiconductor layer 30 is made of, for example, a Group III-V compound semiconductor in some embodiments. In one embodiment, the compound semiconductor layer 30 is InP.

The compound semiconductor layer 30 can be selectively epitaxially formed on the recessed Si region 20 by using metal organic chemical vapor deposition (MOCVD), molecular beam epitaxy (MBE) or atomic layer deposition (ALD). As shown in FIG. 3, the compound semiconductor layer 30 is grown above the level of the upper surface of the STI 15, so as to protrude from the STI 15. The protrusion amount H1 is in a range from about 1 nm to about 30 nm in some embodiments. In some embodiments, the compound semiconductor layer 30 is laterally grown over the upper surface of the STI 15. As shown in FIG. 3, the compound semiconductor layer 30 has a triangular top shape in the cross section, two sides of which correspond to (111) planes of the compound semiconductor layer. In other embodiments, the compound semiconductor layer 30 is grown at or below the level of the upper surface of the STI 15, i.e., H1≤0 nm. In certain embodiments, −10 nm≤H1≤0 nm.

Figures 4A, 4B:
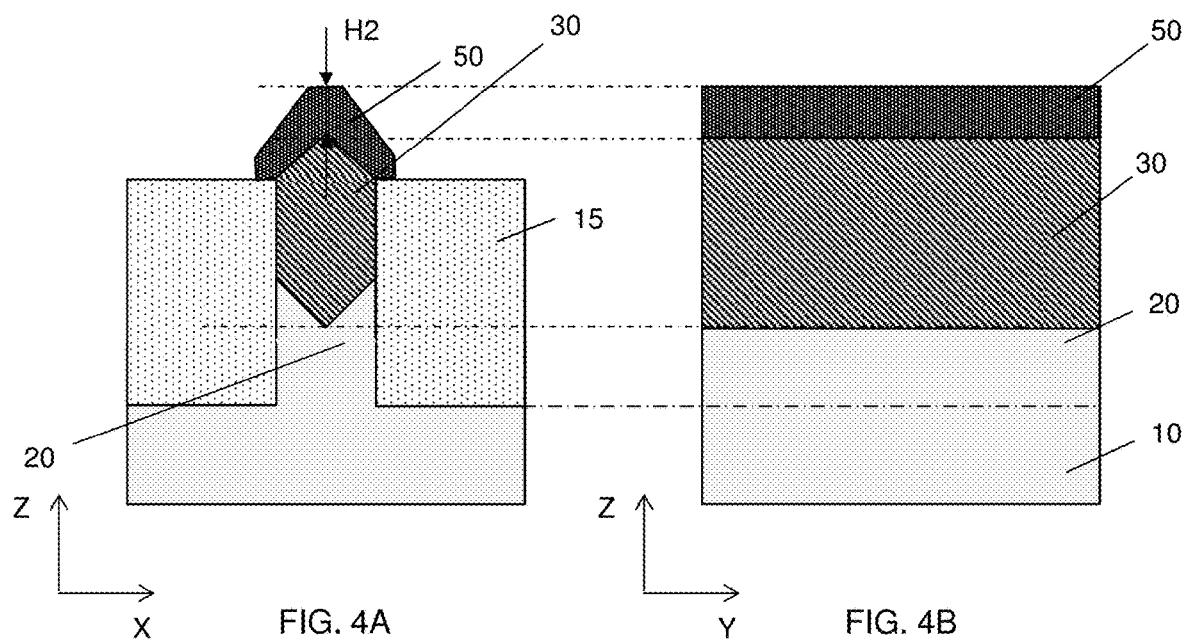
FIGS. 4A and 4B show exemplary cross sectional views of one of the various stages for manufacturing a III-V semiconductor FET device according to one embodiment of the present disclosure.

After the compound semiconductor layer 30 is grown, a Group III-V semiconductor layer 50 is formed over the compound semiconductor layer 30, as shown in FIGS. 4A and 4B. In one embodiment, the Group III-V semiconductor layer 50 is an InAs layer. The InAs layer can be selectively epitaxially formed on the compound semiconductor layer 30 by MOCVD, MBE or ALD. The thickness H2 of the Group III-V semiconductor layer 50 is in a range from about 2 nm to about 30 nm in some embodiments.

In some embodiments, the Group III-V semiconductor layer 50 is laterally grown over the upper surface of the STI 15. The Group III-V semiconductor layer 50 may have a symmetric "boomerang" shape.

Figures 5A, 5B:
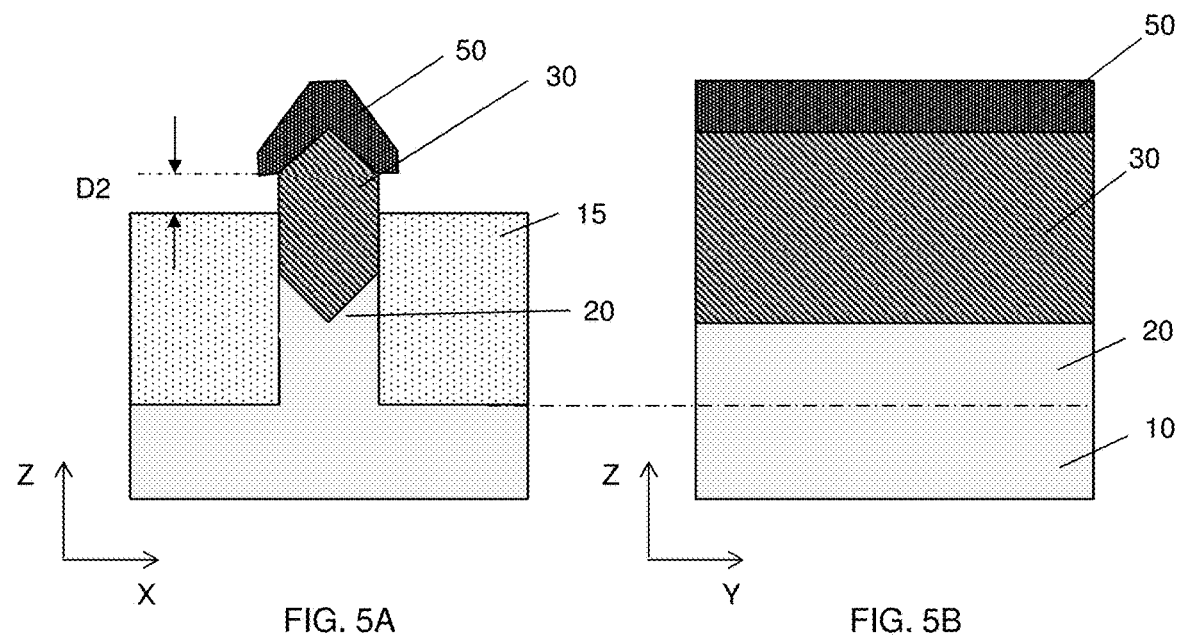
FIGS. 5A and 5B show exemplary cross sectional views of one of the various stages for manufacturing a III-V semiconductor FET device according to one embodiment of the present disclosure.

After the Group III-V semiconductor layer 50 is formed, the height of the STI 15 is reduced (recessed) so as to expose a part of the compound semiconductor layer 30 under the Group III-V semiconductor layer 50, as shown in FIG. 5A. The STI 15 can be partially removed by dry and/or wet etching. After the height of the STI 15 is reduced, the height D2 of the upper surface of the Group III-V semiconductor layer 50 from the surface of the STI 15 is in a range from about 5 nm to about 30 nm in some embodiments, and is in a range from about 10 nm to about 20 nm in other embodiments.

Figure 6A:
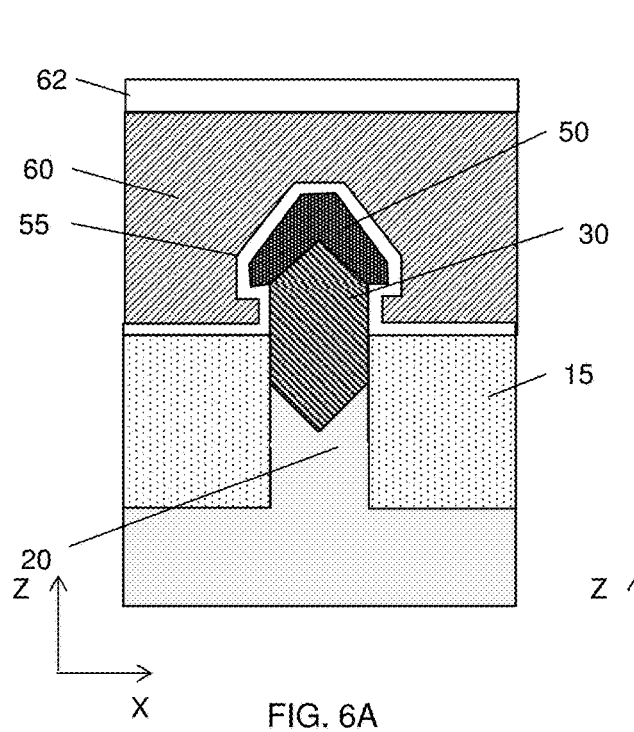
FIGS. 6A and 6B show exemplary cross sectional views of one of the various stages for manufacturing a III-V semiconductor FET device according to one embodiment of the present disclosure.
Figure 6B:
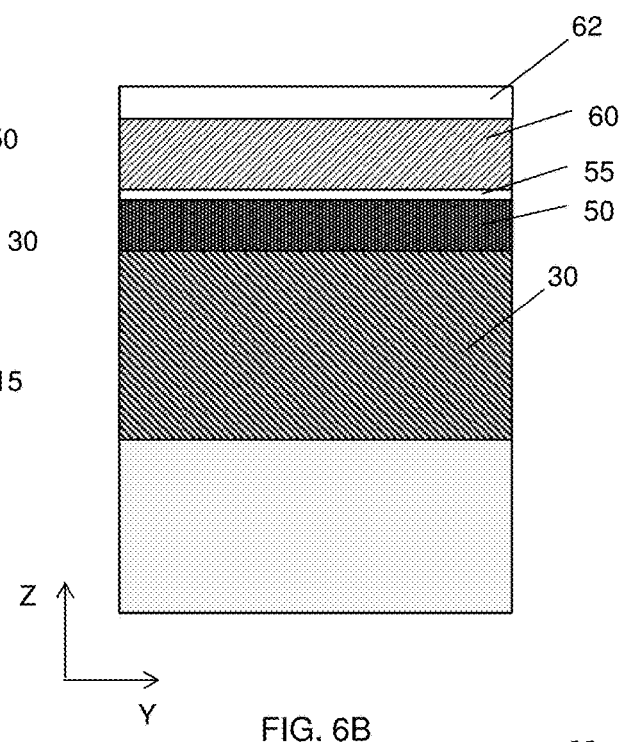

After the STI 15 is recessed, a dummy gate dielectric layer 55 and a dummy gate electrode layer 60 are formed, as shown in FIGS. 6A and 6B. Further, a hard mask layer 62, made of, for example, silicon oxide, silicon nitride or silicon oxynitride, is formed on the dummy gate electrode layer 60. The dummy gate dielectric layer 55 is made of, for example, silicon oxide, and the dummy gate electrode layer 60 is made of, for example, polysilicon. The dummy gate dielectric layer 55, the dummy gate electrode 60 and the hard mask layer 62 can be formed by a suitable film forming method, such as CVD. The thickness of the dummy gate dielectric layer 55 is in a range from about 2 nm to about 20 nm and the thickness of the dummy gate electrode layer 60 as deposited is in a range from about 150 nm to about 500 nm, in some embodiments. The thickness of the hard mask layer 62 as deposited is in a range from about 50 nm to about 200 nm in some embodiments. In some embodiments, after the polysilicon layer 60 is deposited, a planarization operation, such as CMP and an etch-back operation, is performed. After the planarization operation, the thickness of the polysilicon layer 60 is in a range from about 80 nm to about 120 nm in some embodiments.

Figure 7A:
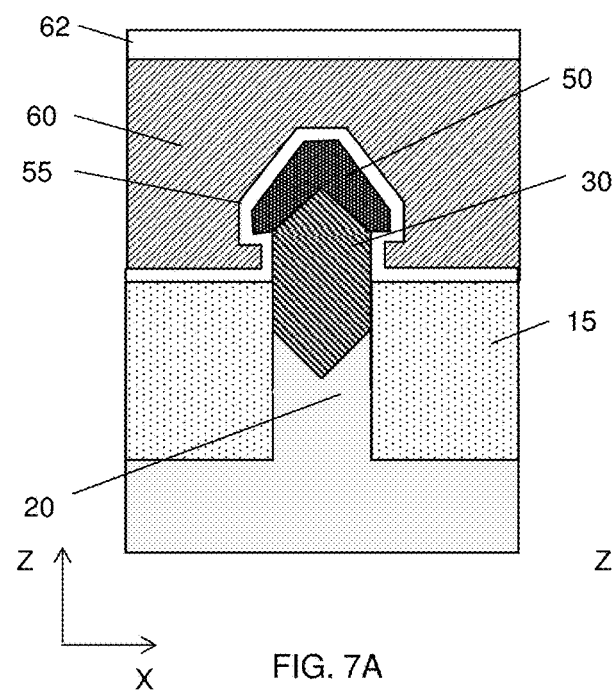
FIGS. 7A and 7B show exemplary cross sectional views of one of the various stages for manufacturing a III-V semiconductor FET device according to one embodiment of the present disclosure.
Figure 7B:
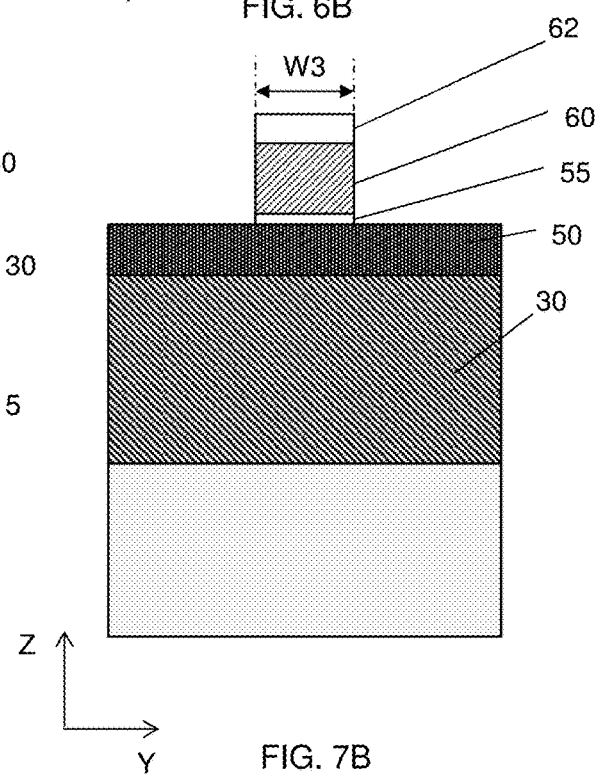

After the dummy gate dielectric layer and the dummy gate electrode layer are formed, these dummy layers are patterned to form a dummy gate structure, as shown in FIGS. 7A and 7B. The width W3 of the dummy gate electrode 60 is in a range from about 10 nm to about 200 nm in some embodiments, and is in a range from about 20 nm to about 100 nm in other embodiments. The dummy gate electrode layer made of polysilicon can be patterned by using a patterned hard mask layer as an etching mask.

Figure 8A:
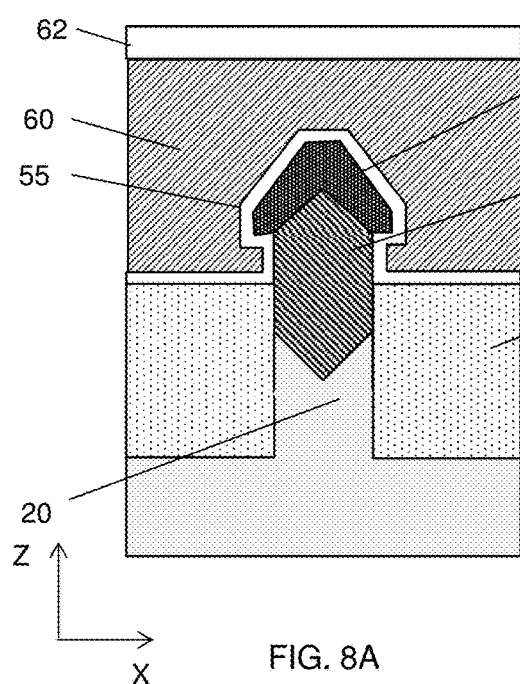
FIGS. 8A and 8B show exemplary cross sectional views of one of the various stages for manufacturing a III-V semiconductor FET device according to one embodiment of the present disclosure.
Figure 8B:
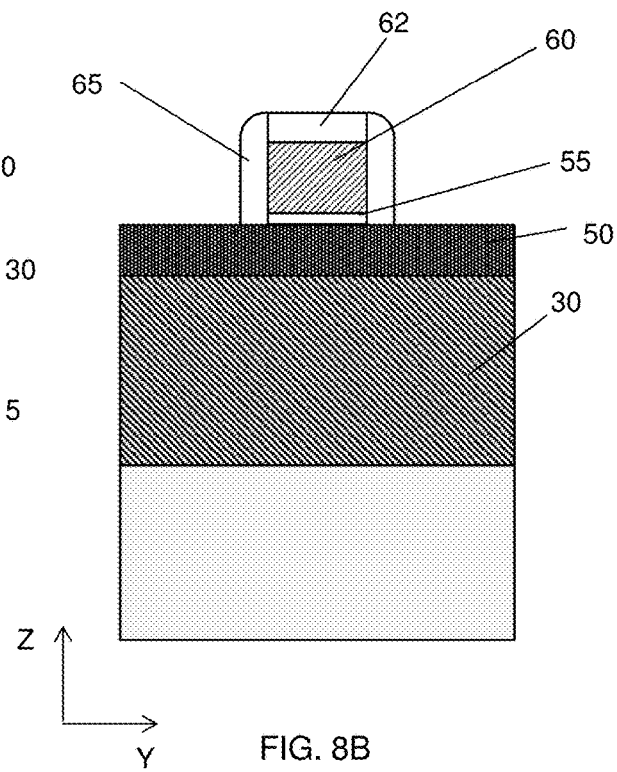

After the dummy gate structure is formed, sidewall spaces 65 are formed on both side faces of the dummy gate structure along the X direction as shown in FIGS. 8A and 8B. The sidewall spacers 65 are made of silicon oxide and/or silicon nitride, which can be made by CVD or ALD (atomic layer deposition).

Figure 9A:
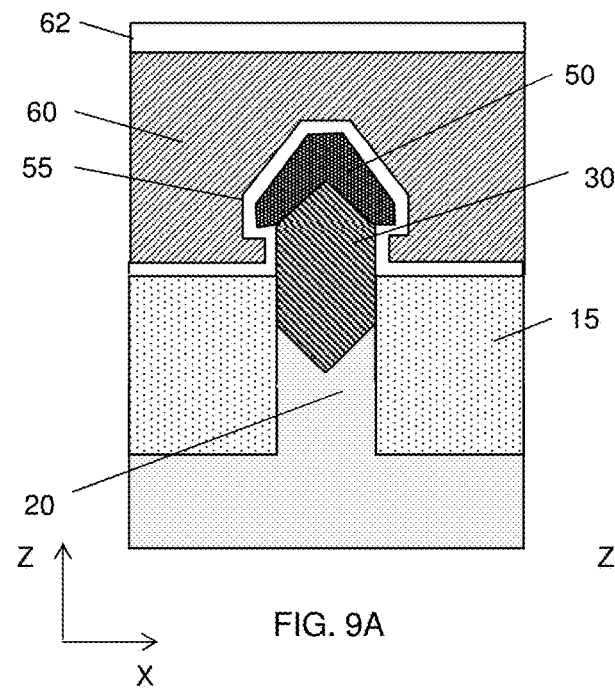
FIGS. 9A and 9B show exemplary cross sectional views of one of the various stages for manufacturing a III-V semiconductor FET device according to one embodiment of the present disclosure.
Figure 9B:
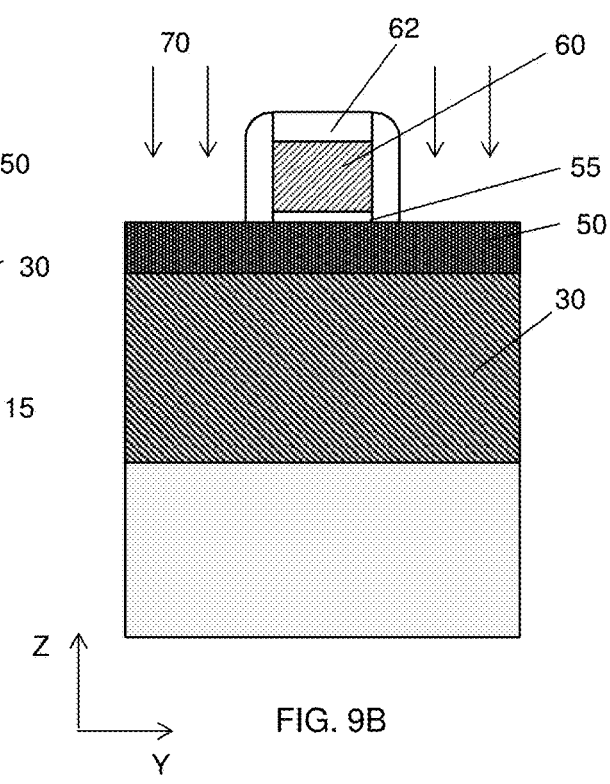
Figure 10A:
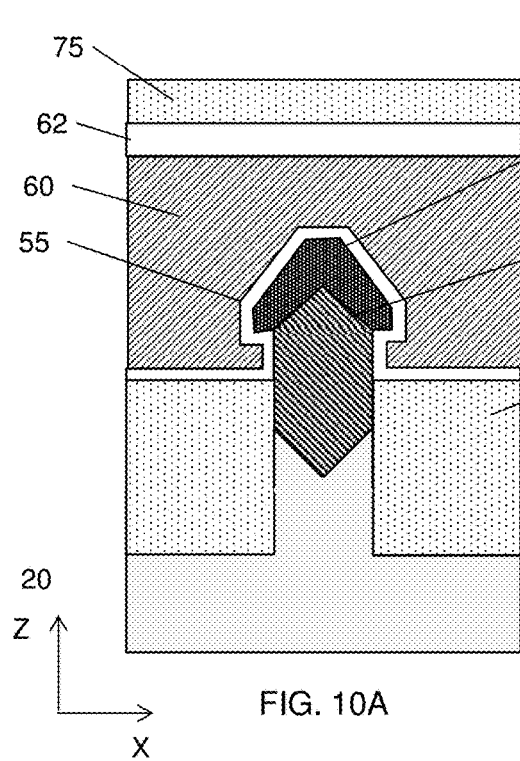
FIGS. 10A and 10B show exemplary cross sectional views of one of the various stages for manufacturing a III-V semiconductor FET device according to one embodiment of the present disclosure.
Figure 10B:
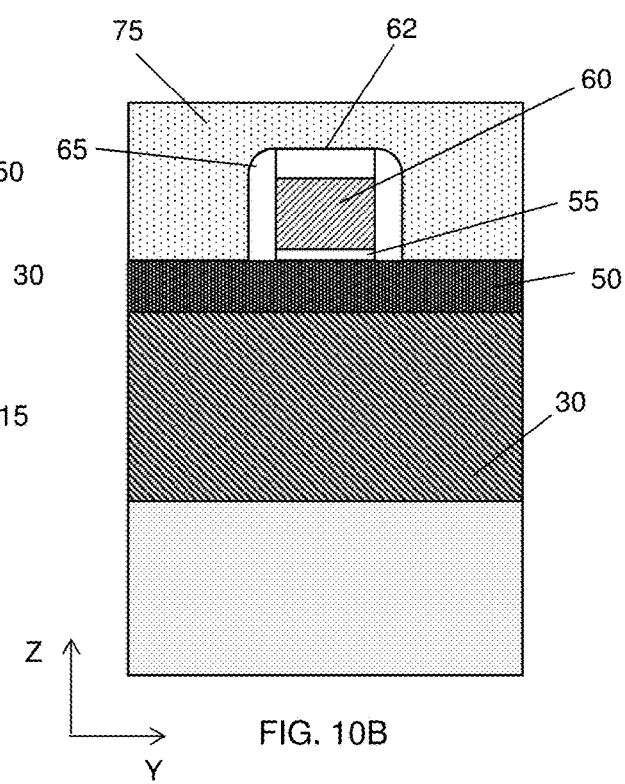
Figure 11A:
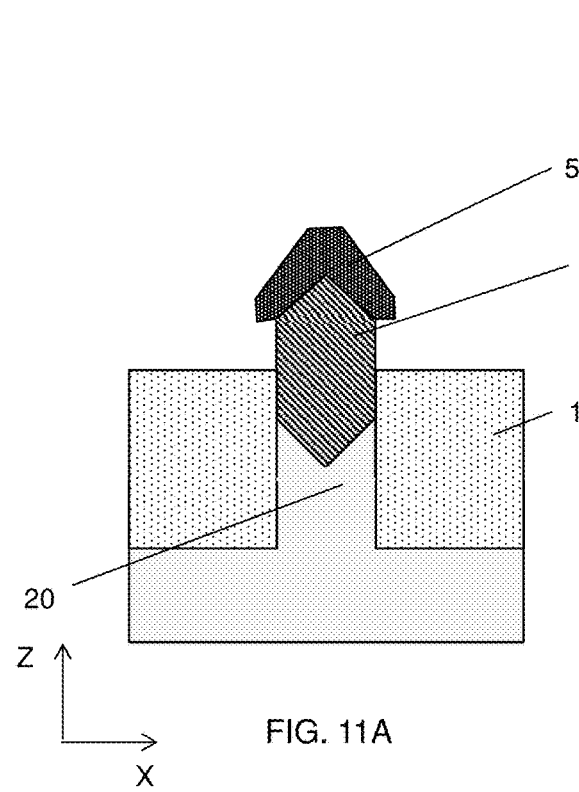
FIGS. 11A and 11B show exemplary cross sectional views of one of the various stages for manufacturing a III-V semiconductor FET device according to one embodiment of the present disclosure.
Figure 11B:
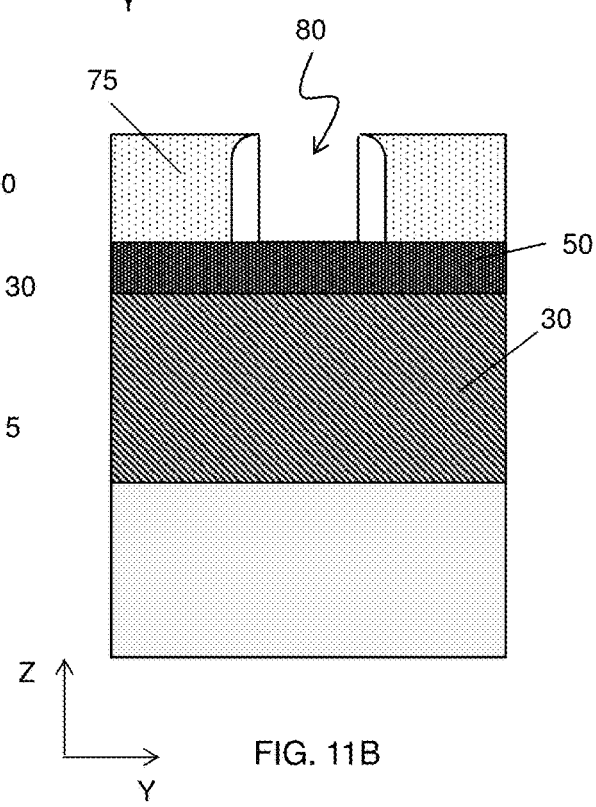

After the sidewall spacers are formed, ion implantation 70 is performed, using Si, An, C, Sn, Se and/or S as dopant, on the source/drain regions of the III-V layer 50, as shown in FIGS. 9A and 9B. In some embodiments, the ion implantation 70 is not performed and a raised source/drain structure is formed. Then, as shown in FIGS. 10A and 10B, a first interlayer dielectric layer (ILD) 75 is formed. The first ILD layer 75 includes one or more layers of silicon oxide, SiOC, SiOCN or SiCN or other low-k materials, or porous materials. After a planarization operation, the dummy gate electrode 60 and the dummy gate dielectric layer 55 are removed as shown in FIGS. 11A and 11B, so as to make a gate space 80.

Figures 12A, 12B:
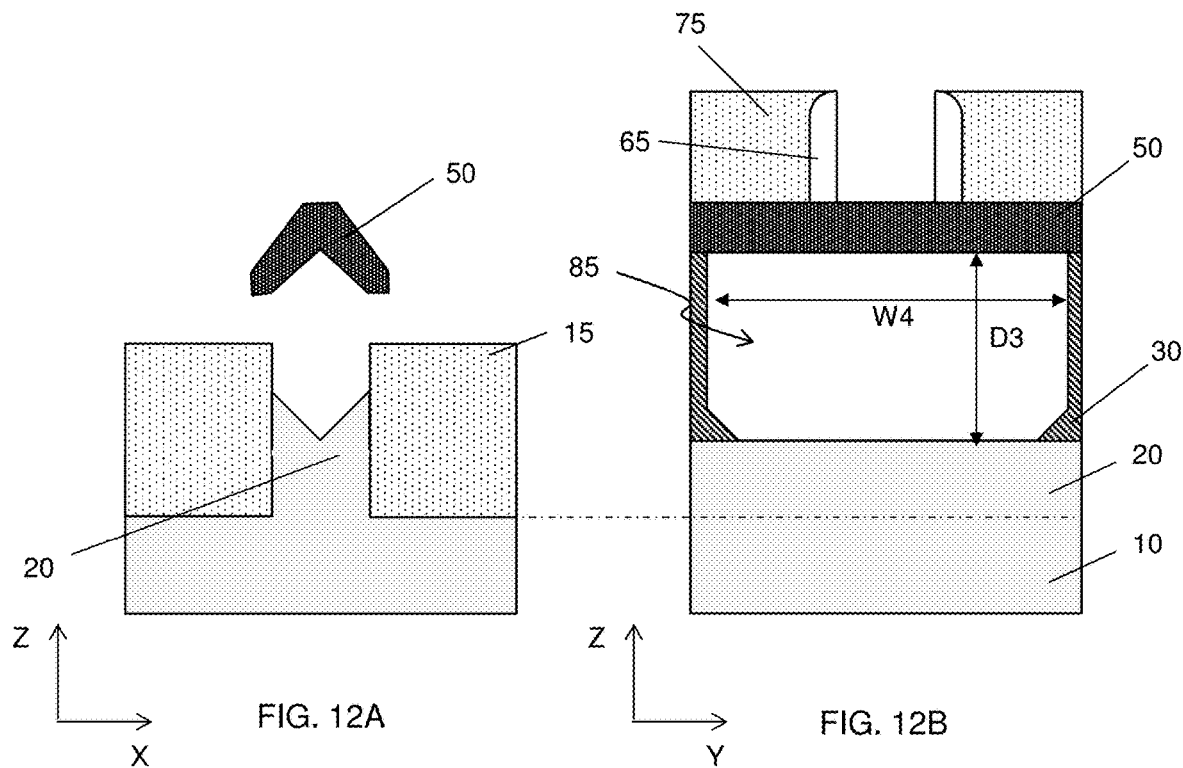
FIGS. 12A and 12B show exemplary cross sectional views of one of the various stages for manufacturing a III-V semiconductor FET device according to one embodiment of the present disclosure.

Then, through the gate space 80, the compound semiconductor layer 50 under the Group III-V semiconductor layer 50 is recessed, thereby forming a space 85, as shown in FIGS. 12A and 12B. The compound semiconductor layer 50 can be etched by wet etching using an HCl solution. In some embodiments, the compound semiconductor layer 50 is fully removed, and in other embodiments, part of the compound semiconductor layer remains.

The depth D3 of the space 85 is in a range from about 50 nm to about 500 nm in some embodiments. The width W4 of the space 85 along the channel direction is greater than the width of the gate space 80, which is substantially equal to the width W3 of the dummy gate electrode, and is in a range from about 25 nm to about 2000 nm in some embodiments.

Figures 13A, 13B:
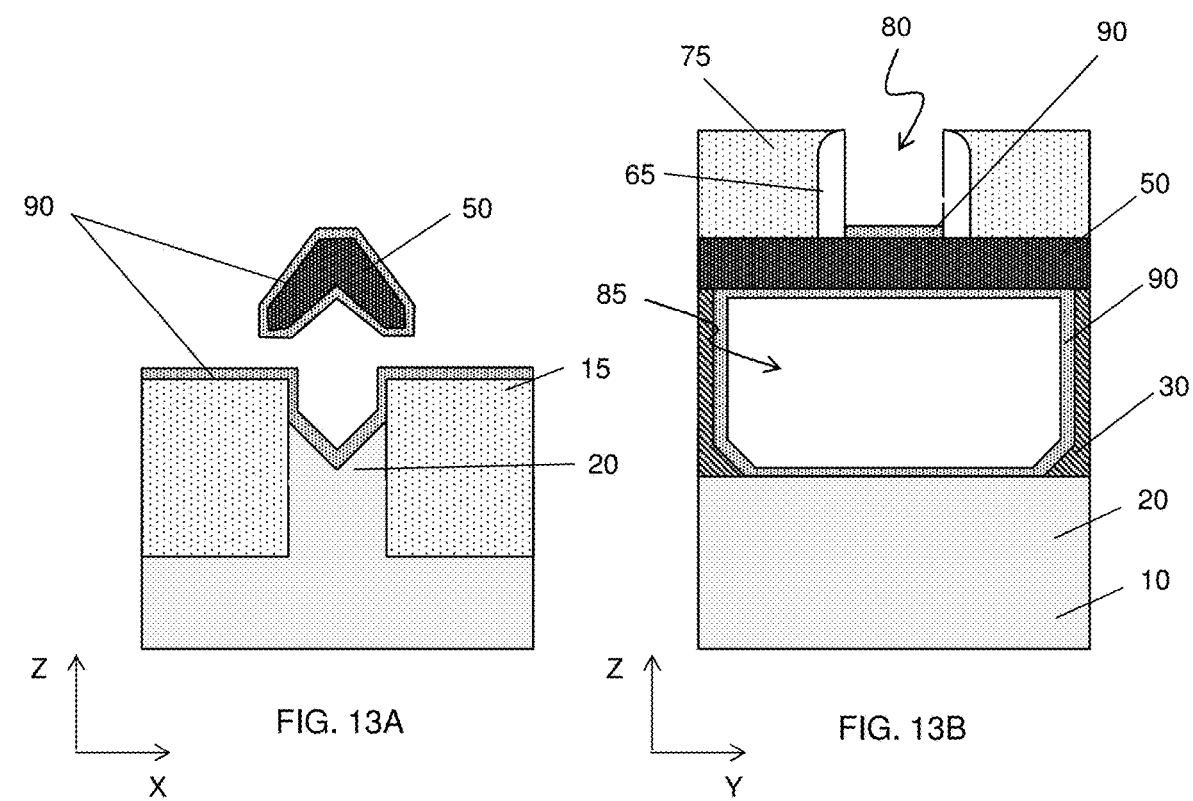
FIGS. 13A and 13B show exemplary cross sectional views of one of the various stages for manufacturing a III-V semiconductor FET device according to one embodiment of the present disclosure.

After the space 85 is formed, a gate dielectric layer 90 is formed around the Group III-V semiconductor layer 50, as shown in FIGS. 13A and 13B. The gate dielectric layer 90 can be formed by CVD or ALD, and is also formed on the surfaces of the STI 15 and the recessed Si region 20. The gate dielectric layer 90 includes a high-k dielectric material having a dielectric constant higher than 10, such as, one or more oxides of Hf, Y, Ta, Ti, Al and Zr. In certain embodiments, $HfO_2$ is used.

Figure 14A:
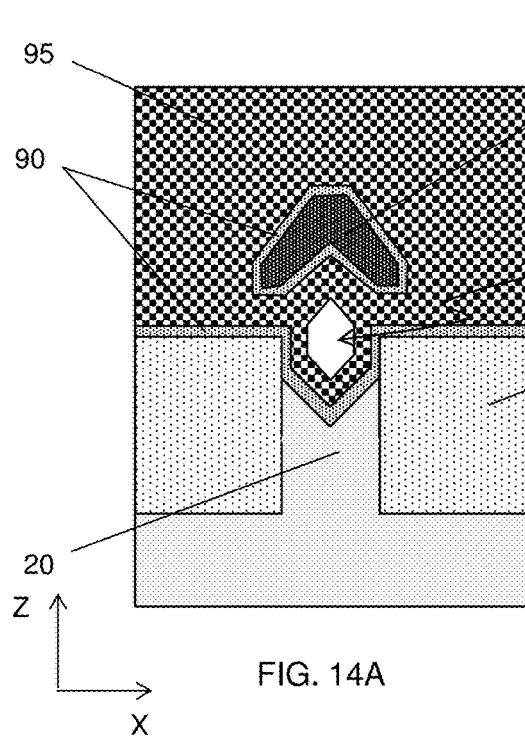
FIGS. 14A and 14B show exemplary cross sectional views of one of the various stages for manufacturing a III-V semiconductor FET device according to one embodiment of the present disclosure.
Figure 14B:
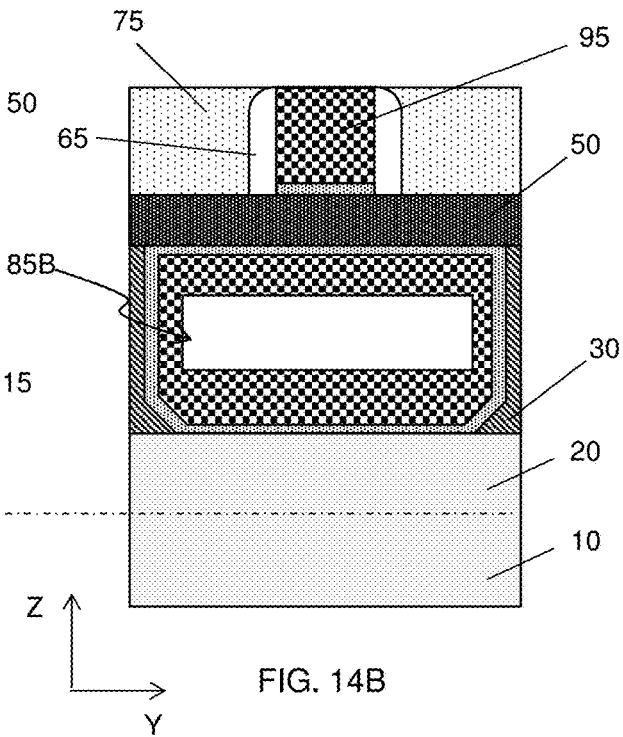

After the gate dielectric layer 90 is formed, a gate electrode 95 is formed, as shown in FIGS. 14A and 14B. The openings 80 and 85 are filled with one or more layers of conductive material, so as to form the gate electrode 95. The conductive material includes one or more of Al, Cu, W, Co, Ti, Ta, TiN, TiAl, TiAlC, TiAlN, TaN, NiSi, CoSi, and other conductive materials. The conductive material is first deposited by CVD, ALD or physical vapor deposition (PVD) including sputtering. After the deposition, a planarization operation, such as CMP, is performed to remove the upper portion of the deposited conductive material. In some embodiments, as shown in FIGS. 14A and 14B, a void 85B is formed in the space 85.

Figure 15A:
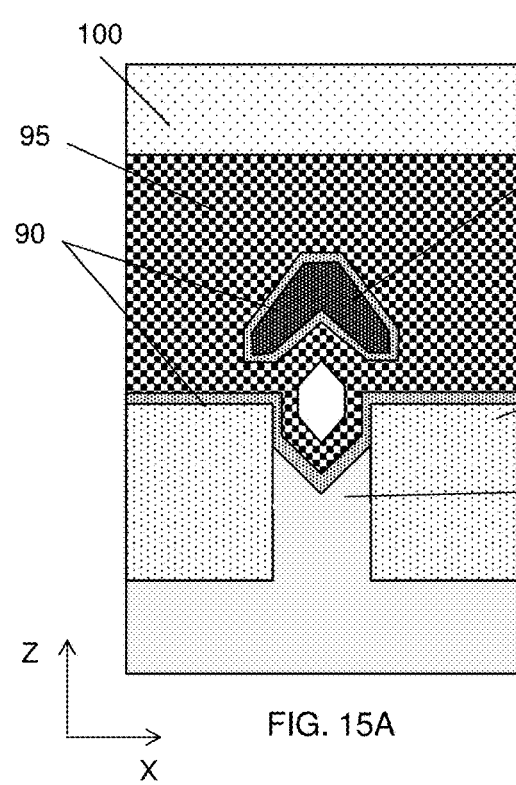
FIGS. 15A and 15B show exemplary cross sectional views of one of the various stages for manufacturing a III-V semiconductor FET device according to one embodiment of the present disclosure.
Figure 15B:
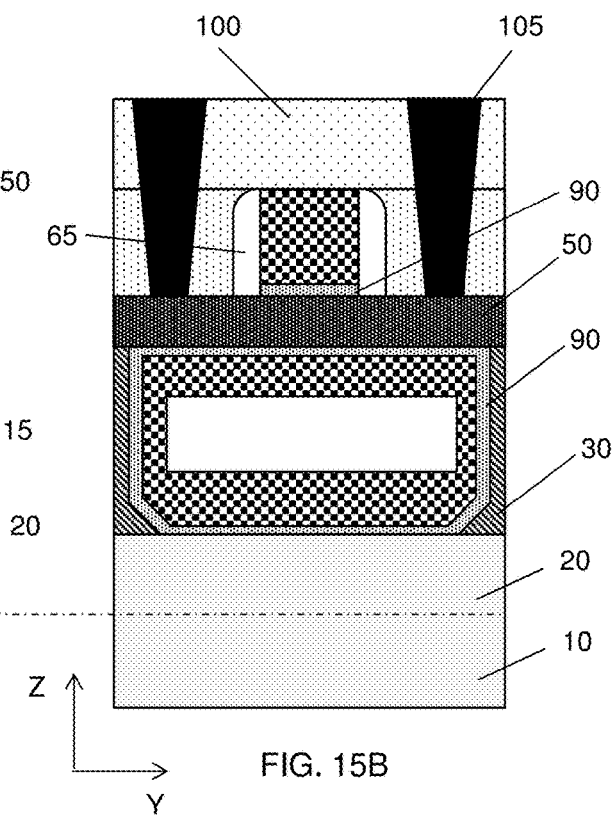

Further, a second ILD layer 100 is formed, contact holes are formed and the contact holes are filled with a conductive material, thereby forming source/drain contacts 105. Accordingly a GAA FET using a Group III-V semiconductor layer 50 is obtained, as shown in FIGS. 15A and 15B. The second ILD layer 100 includes one or more layers of silicon oxide, SiOC, SiOCN or SiCN or other low-k materials, or porous materials. The conductive material for the source/ drain contacts includes one or more of Al, Cu, W, Co, Ti, Ta, TiN, TiAl, TiAlC, TiAlN, TaN, NiSi, CoSi, and other conductive materials.

In certain embodiments, the space 85 is fully filled by the conductive material 95 and no void is formed, as shown in FIGS. 16A and 16B. In certain embodiments, the source/drain region of the Group III-V semiconductor layer 50 is removed and raised source/drain structures 40 are formed, as shown in FIG. 17. The raised source/drain structures 40 include semiconductor crystal material and provide appropriate stress to the channel. In some embodiments, the raised source/drain structures 40 are formed without removing the source/drain region of the Group III-V semiconductor layer 50, thereby forming multi-layer source/drain structure.

Figure 18:
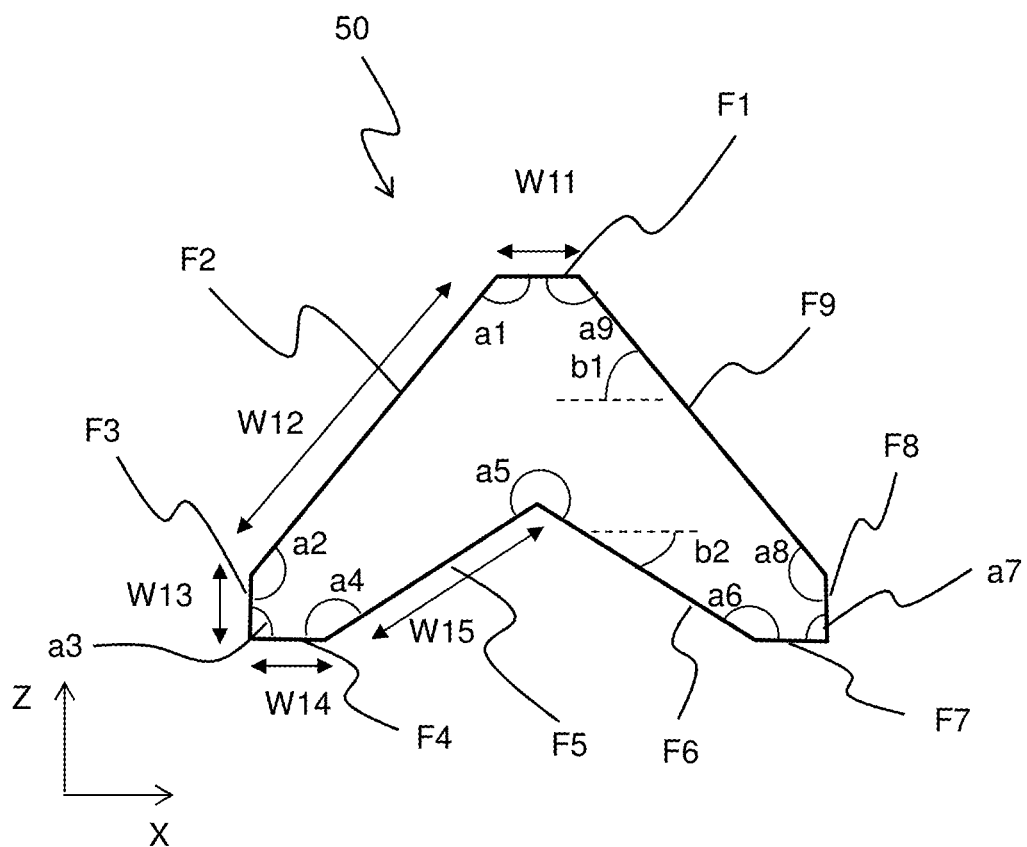
FIG. 18 shows an exemplary cross sectional view of a III-V semiconductor layer formed according to one embodiment of the present disclosure.

FIG. 18 shows an exemplary cross sectional view of a III-V semiconductor layer formed according to one embodiment of the present disclosure. As shown in FIG. 18, the Group III-V semiconductor layer 50 has first to ninth facets, F1-F9, connected in this order. The first, fourth and seventh facets, F1, F4 and F7 are parallel with each other. The third and eighth facets, F3 and F8 are parallel with each other. Each corner made by adjacent two facets may be rounded. The Group III-V semiconductor layer 50 has a symmetric cross section as shown in FIG. 18 in one embodiment.

A first angle a1 formed inside the Group III-V semiconductor layer 50 by the first facet F1 and the second facet F2 is greater than 90°, a second angle a2 formed inside the Group III-V semiconductor layer 50 by the second facet F2 and the third facet F3 is greater than 90°, a third angle a3 formed inside the Group III-V semiconductor layer 50 by the third facet F3 and the fourth facet F4 is substantially 90°, a fourth angle a4 formed inside the Group III-V semiconductor layer 50 by the fourth facet F4 and the fifth facet F5 is greater than 90°, a fifth angle a5 formed inside the Group III-V semiconductor layer 50 by the fifth facet F5 and the sixth facet F6 is greater than 180°, a sixth angle a6 formed inside the Group III-V semiconductor layer 50 by the sixth facet F6 and the seventh facet F7 is greater than 90°, a seventh angle a7 formed inside the Group III-V semiconductor layer 50 by the seventh facet F7 and the eighth facet F8 is substantially 90°, an eighth angle a8 formed inside the Group III-V semiconductor layer 50 by the eighth facet F8 and the ninth facet F9 is greater than 90°, and a ninth angle a9 formed inside the Group III-V semiconductor layer 50 by the ninth facet F9 and the first facet F1 is greater than 90°. Here, "substantially 90°" means 90°±4.5°. The angle b1 formed by a line parallel to the first facet F1 and the ninth facet F9 (the smaller angle) is in a range from about 30° to about 60° in some embodiments. The angle b2 formed by a line parallel to the first facet F1 and the sixth facet F6 (the smaller angle) is in a range from about 30° to about 60° in some embodiments. The angle a5 is in a range from about 240° to about 300° in some embodiments.

The first angle a1 and the ninth angles a9 are substantially equal to each other, and are in a range from about 120° to about 150° in some embodiments. The second angle a2 and the eighth angle a8 are substantially equal to each other, and are in a range from about 120° to about 150° in some embodiments. The fourth angle a4 and the sixth angle a6 are substantially equal to each other, and are in a range from about 120° to about 150° in some embodiments. In some embodiments, the fourth angle a4 and the sixth angle a6 are greater than the second angle a2 and the eighth angle a8.

In one embodiment, the first, the fourth and seventh facets F1, F4 and F7 correspond to a (001) plane of the InAs (the Group III-V semiconductor layer 50), the second and the ninth facets F2 and F9 correspond to a (111) plane of the InAs, and the third and the eighth facets F3 and F8 correspond to a (110) plane of the InAs. In such a case, the angles a1, a2, a8 and a9 are about 125°. In certain embodiments, the fifth and the sixth facets F5 and F6 correspond to a (311) plane of the InAs.

The width W11 of the facet F1 is in a range from about 0.5 nm to about 5.0 nm in some embodiments. The width W12 of the facet F2 is substantially equal to the width of the facet F9, and is in a range from about 10.0 nm to about 50.0 nm in some embodiments. The width W13 of the facet F3 is substantially equal to the width of the facet F8, and is in a range from about 0.5 nm to about 5.0 nm in some embodiments. The width W14 of the facet F4 is substantially equal to the width of the facet F7, and is in a range from about 0.5 nm to about 5.0 nm in some embodiments. The width W15 of the facet F5 is substantially equal to the width of the facet F6, and is in a range from about 5.0 nm to about 30.0 nm in some embodiments.

Figure 19:
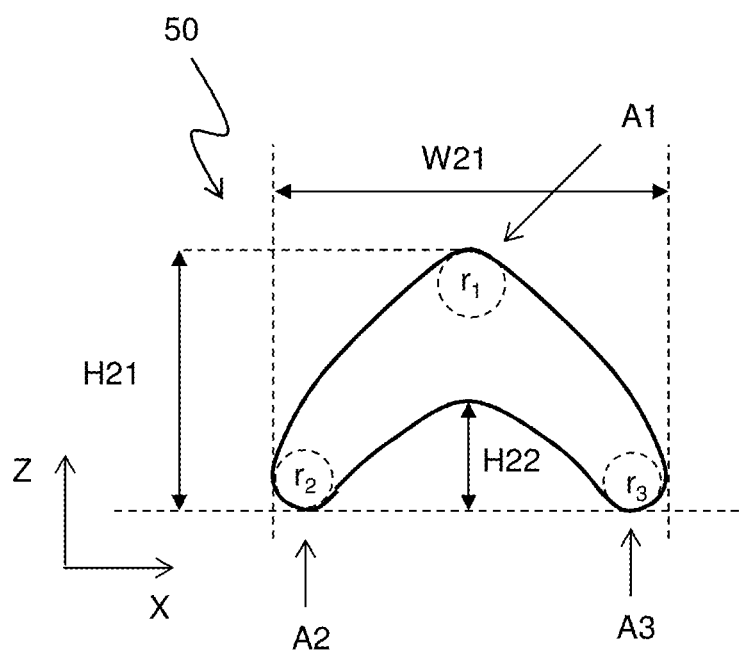
FIG. 19 shows an exemplary cross sectional view of a III-V semiconductor layer formed according to another embodiment of the present disclosure.

FIG. 19 shows an exemplary cross sectional view of a III-V semiconductor layer formed according to another embodiment of the present disclosure. The overall cross sectional shape of the Group III-V semiconductor layer 50 of FIG. 19 is similar to that of FIG. 18, but the shape of FIG. 19 has a rounded "boomerang" shape having a convex top surface, a concave bottom surface and rounded corners.

The entire width W21 of the Group III-V semiconductor layer 50 is in a range from about 10.0 nm to about 60.0 nm in some embodiments. The entire height H21 of the Group III-V semiconductor layer 50 is in a range from about 10.0 nm to about 40.0 nm in some embodiments. The height H22 of the concave portion of the Group III-V semiconductor layer 50 is in a range from about 0.5 nm to about 10.0 nm in some embodiments. The radius of curvature r1 of the first apex A1 is in a range from about 0.5 nm to about 10.0 nm in some embodiments, and the radii of curvature r2 and r3 of the second and third apex A2 and A3 are in a range from about 0.5 nm to about 10.0 nm in some embodiments.

Figure 20A:
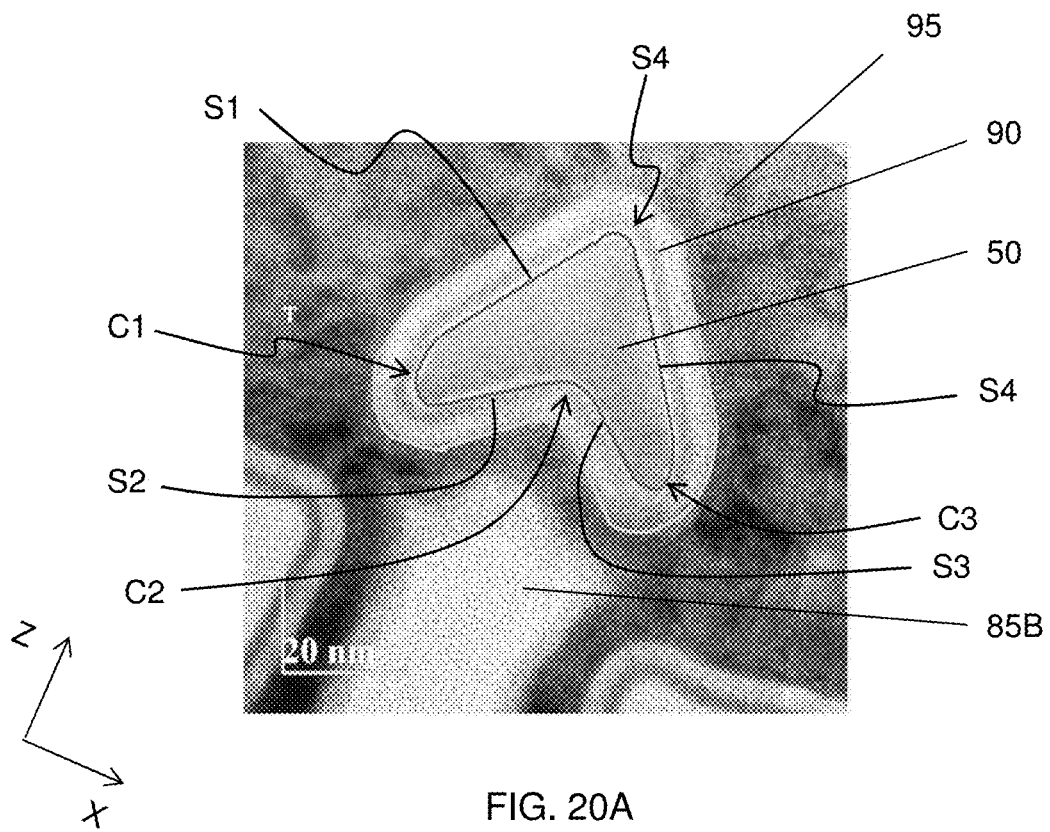
FIG. 20A shows a transmission electron microscope (TEM) image of the cross section of III-V semiconductor layer formed according to an embodiment of the present disclosure.
Figure 20B:
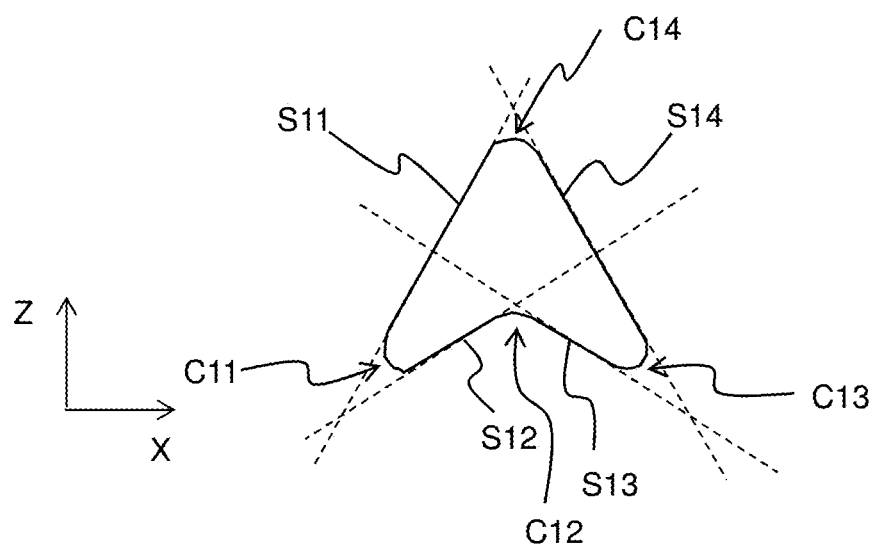
FIG. 20B shows an outline of the cross section of III-V semiconductor layer.

FIG. 20A shows a transmission electron microscope (TEM) image of the cross section of III-V semiconductor layer 50 formed according to the embodiment of the present disclosure. FIG. 20B shows an outline of the cross section of III-V semiconductor layer 50. As shown in FIGS. 20A and 20B, the III-V semiconductor layer 50 has a "boomerang" shape having four major surfaces S11, S12, S13 and S14 and four rounded corner surfaces C11, C12, C13 and C14. Of course, there are two opposing end surfaces. The corner surface C11 connects the surfaces S11 and S12, the corner surface C12 connects the surfaces S12 and S13, the corner surface C13 connects the surfaces S13 and S14 and the corner surfaces C14 connects the surfaces S14 and S11. The three corner surfaces C11, C13 and C14 are convex and the corner surface C12 is concave.

The major surfaces S11-S14 are substantially flat in some embodiments. The major surfaces S12 and S13 are in contact with the two (111) planes of the compound semiconductor layer 30, before the compound semiconductor layer 30 is removed. Extended planes of the surfaces S11 and S12, extended planes of the surfaces S13 and S14 and extended planes of the surfaces S14 and S11 make an acute angle, respectively. In some embodiments, the acute angle is about 30° to about 60. Extended planes of the surfaces S12 and S13 make an angle of about 60° to about 150° in some embodiments. In certain embodiments, this angle is about 90° to about 150°. In other embodiments, this angle is obtuse angle.

Figure 21:
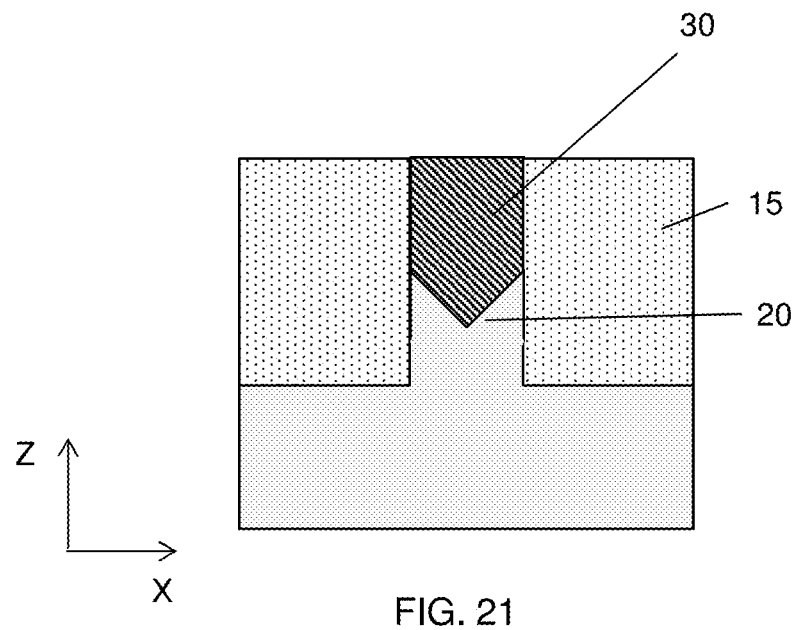
FIGS. 21-23 show exemplary cross sectional views of various stages for manufacturing a III-V semiconductor FET device according to another embodiment of the present disclosure.
Figure 22:
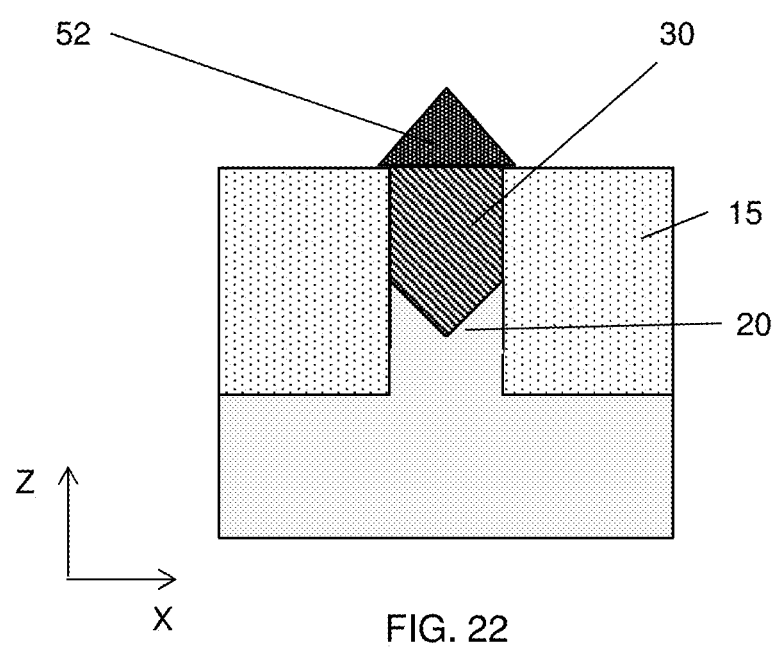
Figure 23:
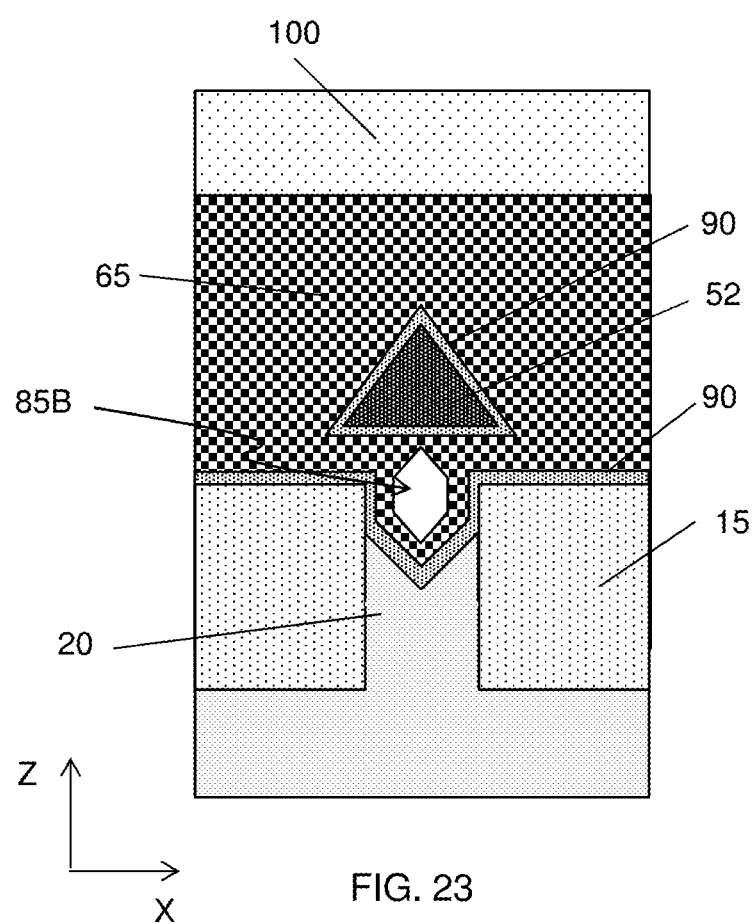

FIGS. 21-23 show exemplary cross sectional views of various stages for manufacturing a III-V semiconductor FET device according to another embodiment of the present disclosure. The configuration, materials, processes and/or dimensions same as or similar to the foregoing embodiment may be employed in the following embodiment, and the detailed explanation thereof may be omitted.

In this embodiment, after the compound semiconductor layer 30 is formed as shown in FIG. 3, the upper portion of the compound semiconductor layer 30 is planarized by, for example, CMP, as shown in FIG. 21. When InP is used, the planarized upper surface is a (100) InP plane.

Then, a Group III-V semiconductor layer 52 is formed over the compound semiconductor layer 30, as shown in FIG. 22. In some embodiments, the Group III-V semiconductor layer 52 is laterally grown over the upper surface of the STI 15. As shown in FIG. 22, the Group III-V semiconductor layer 50 has a substantially triangular cross sectional shape.

After the Group III-V semiconductor layer 50 is formed, similar operations as explained with FIGS. 5A/5B to 15A/15B, a GAA FET using a Group III-V semiconductor layer 52 is obtained, as shown in FIG. 23.

Figure 24:
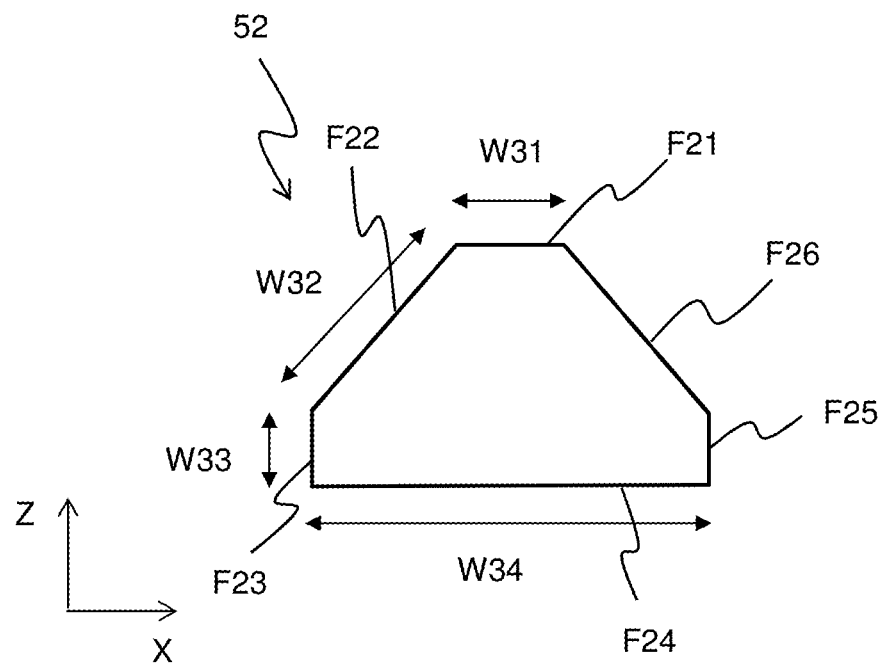
FIG. 24 shows an exemplary cross sectional view of a III-V semiconductor layer formed according to another embodiment of the present disclosure.

FIG. 24 shows an exemplary cross sectional view of a III-V semiconductor layer formed according to another embodiment of the present disclosure. The cross sectional shape of the Group III-V semiconductor layer 52 shown in FIG. 24 corresponds to the case where the angles a4, a5 and a6 are 180° in FIG. 18, and thus the angle ranges of FIG. 18 are applied to FIG. 19.

In one embodiment, the first and the fourth facets F21 and F24 correspond to a (001) plane of the InAs (the Group III-V semiconductor layer 52), the second and the sixth facets F22 and F26 correspond to a (111) plane of the InAs, and the third and the fifth facets F23 and F25 correspond to a (110) plane of the InAs.

The width W31 of the facet F21 is in a range from about 0 nm to about 5.0 nm in some embodiments. The width W32 of the facet F22 is substantially equal to the width of the facet F26, and is in a range from about 10.0 nm to about 50.0 nm in some embodiments. The width W33 of the facet F23 is substantially equal to the width of the facet F25, and is in a range from about 0 nm to about 5.0 nm in some embodiments. The width W34 of the facet F24 is in a range from about 10.0 nm to about 60.0 nm in some embodiments. When the widths W31 and W33 are equal to 0 nm, the cross sectional shape is a triangle.

Figure 25:
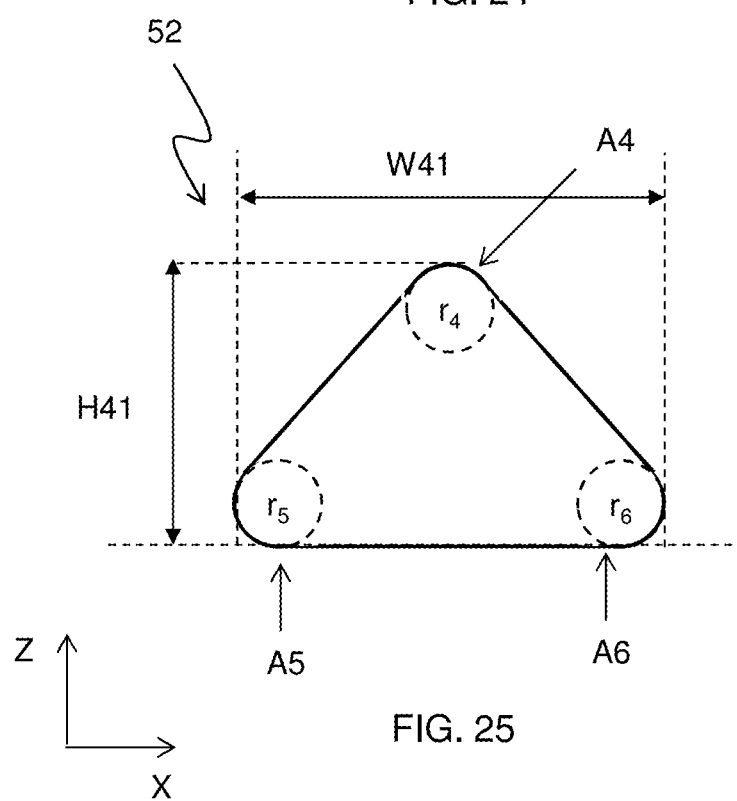
FIG. 25 shows an exemplary cross sectional view of a III-V semiconductor layer formed according to another embodiment of the present disclosure.

FIG. 25 shows an exemplary cross sectional view of a III-V semiconductor layer 52 formed according to another embodiment of the present disclosure. The overall cross sectional shape of the Group III-V semiconductor layer 52 of FIG. 25 is similar to that of FIG. 24, but the shape of FIG. 25 has a rounded triangular shape having rounded corners.

The entire width W41 of the Group III-V semiconductor layer 52 is in a range from about 10.0 nm to about 60.0 nm in some embodiments. The entire height H41 of the Group III-V semiconductor layer 52 is in a range from about 10.0 nm to about 40.0 nm in some embodiments. The radius of curvature r4 of the first apex A4 is in a range from about 0.5 nm to about 10.0 nm in some embodiments, and the radii of curvatures r5 and r6 of the second and third apex A5 and A6 are in a range from about 0.5 nm to about 10.0 nm in some embodiments.

Figure 26A:
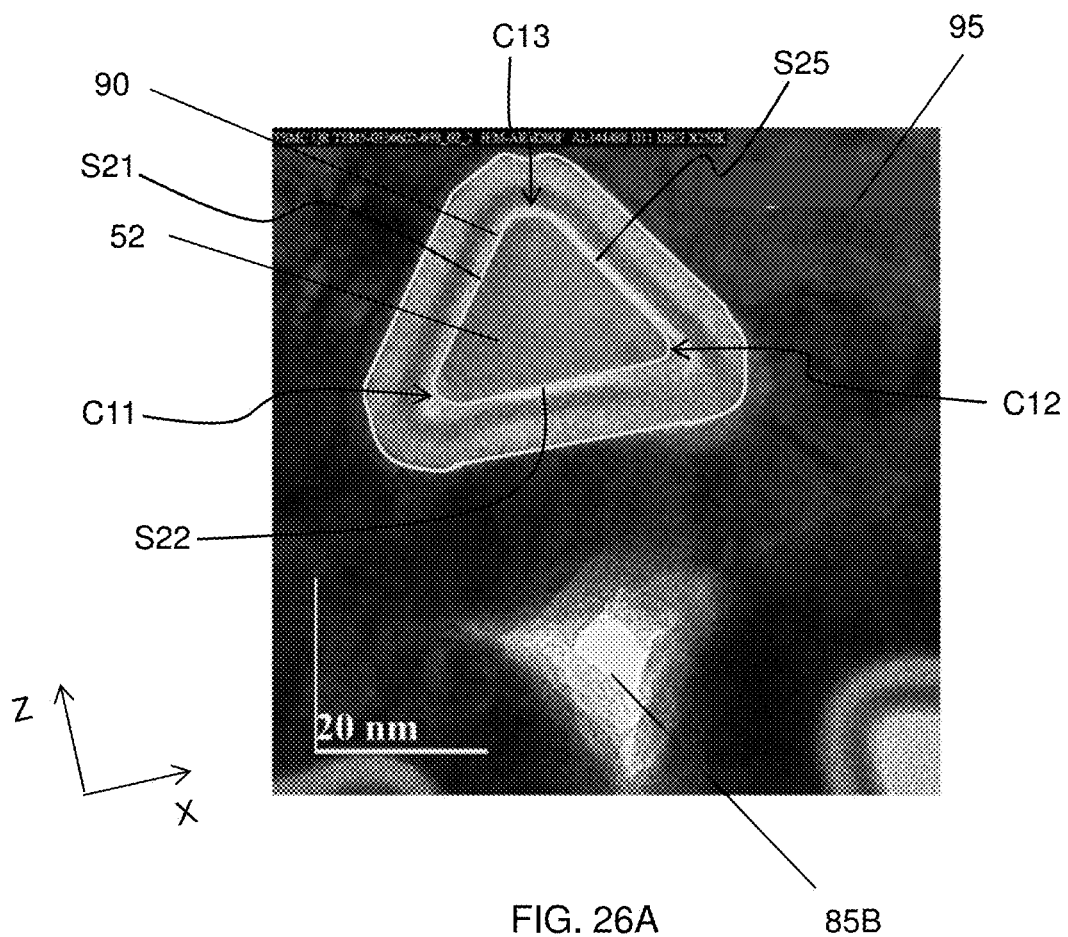
FIG. 26A shows a transmission electron microscope (TEM) image of the cross section of III-V semiconductor layer formed according to an embodiment of the present disclosure.
Figure 26B:
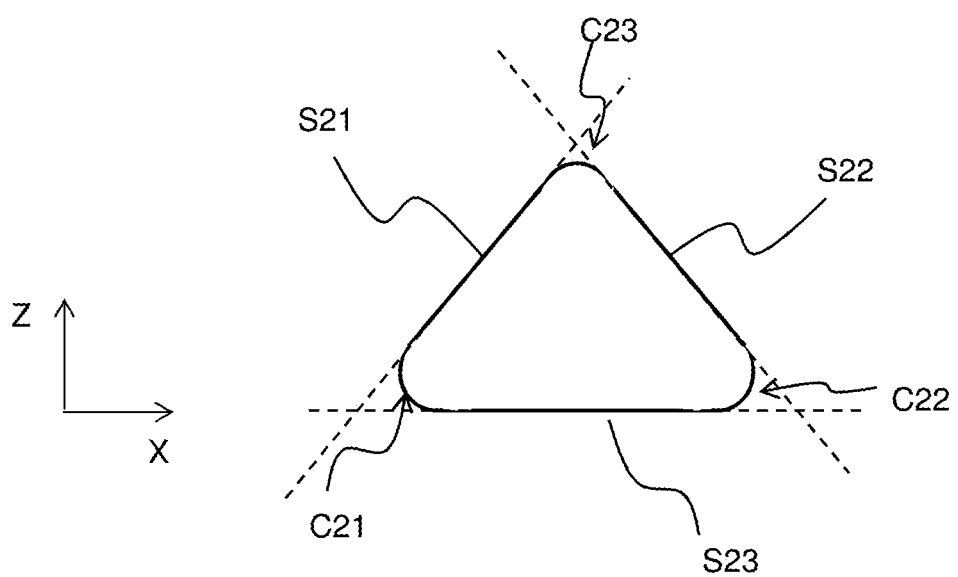
FIG. 26B shows an outline of the cross section of III-V semiconductor layer.

FIG. 26A shows a transmission electron microscope (TEM) image of the cross section of III-V semiconductor layer 52 formed according to an embodiment of the present disclosure. FIG. 26B shows an outline of the cross section of III-V semiconductor layer 52. As shown in FIGS. 26A and 26B, the III-V semiconductor layer 52 has a cross section having a substantially triangular shape with rounded corners, and has three major surfaces S21, S22 and S23 and three rounded corner surfaces C21, C22 and C23. Of course, there are two opposing end surfaces. The corner surface C21 connects the surfaces S21 and S22, the corner surface C22 connects the surfaces S22 and S23, and the corner surface C23 connects the surfaces S23 and S21. The corner surfaces C21-C23 are convex.

The major surfaces S21-S23 are substantially flat in some embodiments. Extended planes of the surfaces S21 and S22, extended planes of the surfaces S22 and S23 and extended planes of the surfaces S23 and S21 make an acute angle, respectively. In some embodiments, the major surface S22, which is in contact with the upper surface of the compound semiconductor layer 30 before the compound semiconductor layer 30 is removed, is wider than other major surfaces S21 and S23.

Figure 27A:
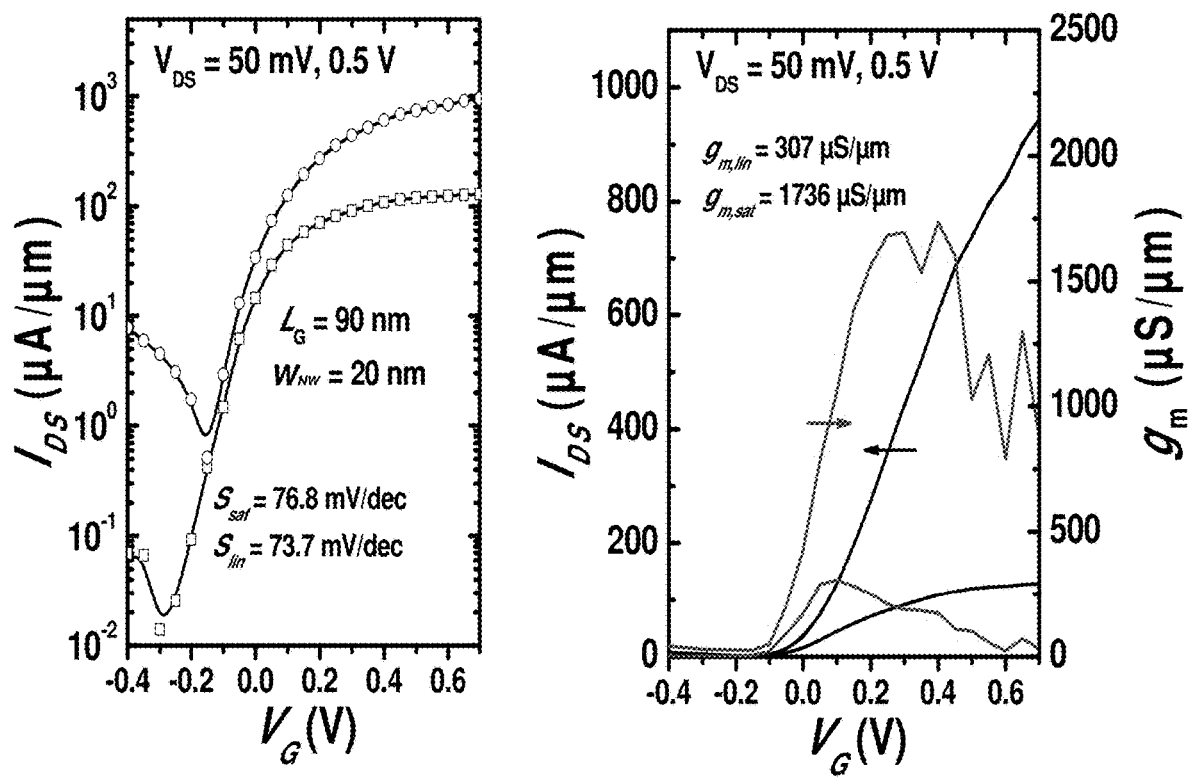
FIGS. 27A and 27B show electric characteristics ($I_{ds}$-$V_{ds}$) of the nano-wire (NW) GAA FET.
Figure 27B:
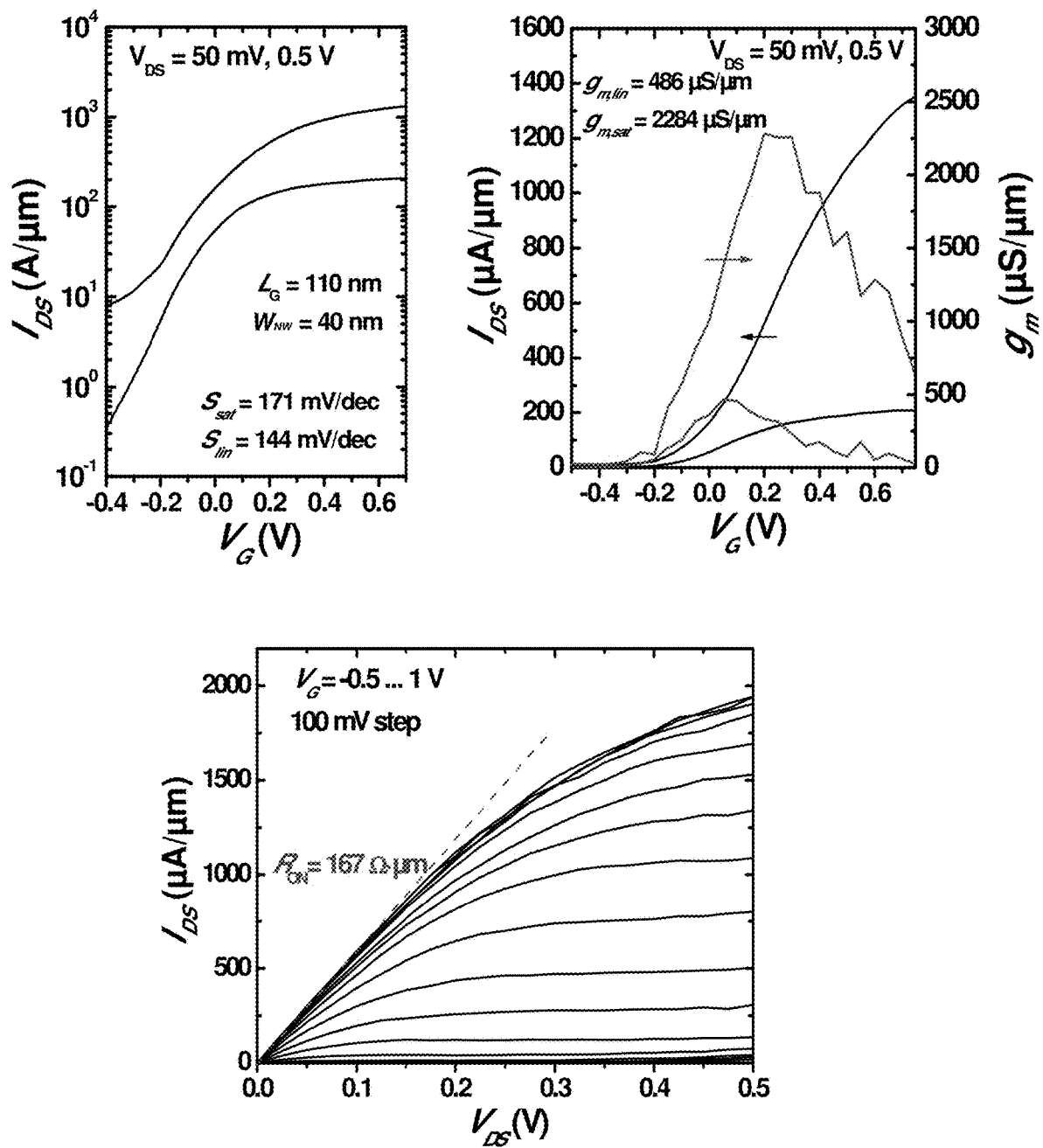

FIGS. 27A and 27B show electric characteristics ($I_{ds}$-$V_{ds}$) of the NW GAA FET. In FIG. 27A, the channel length $L_g$=90 nm and the gate length $W_{fin}$=20 nm, and in FIG. 27B, the channel length $L_g$=110 nm and the gate length $W_{NW}$=40 nm. The measured peak transconductance $g_m$ of 1763 μS/μm, subthreshold swing SS of 76.8 mV/dec and Q=$g_m$/SS of 22 were obtained for Lg=90 nm at $W_{NW}$=20 nm. Further, the measured peak transconductance $g_m$ of 2284 μS/μm, subthreshold swing SS of 171 mV/dec and Q=$g_m$/SS of 13.4 were obtained for Lg=110 nm at $W_{NW}$=40 nm. In FIG. 27B, a very high peak-$g_m$=2.3 mS/μm and a very low on-resistance $R_{on}$=167 Ω·μm were obtained.

Figure 28A:
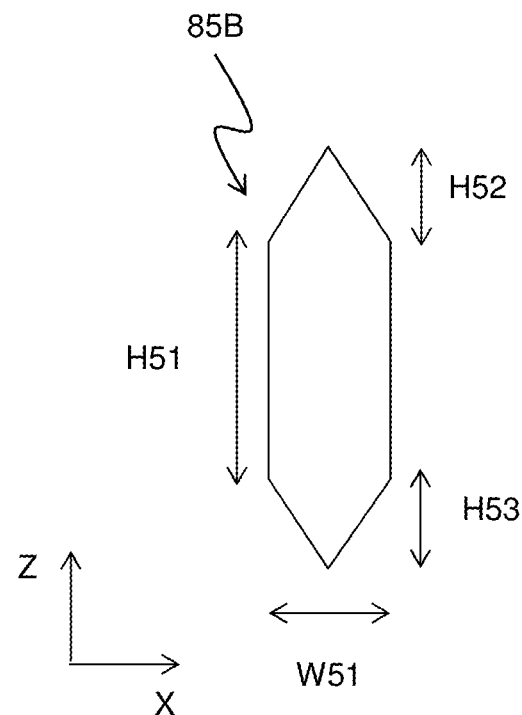
FIGS. 28A and 28B show exemplary cross sectional views of a void formed under the III-V semiconductor layer.
Figure 28B:
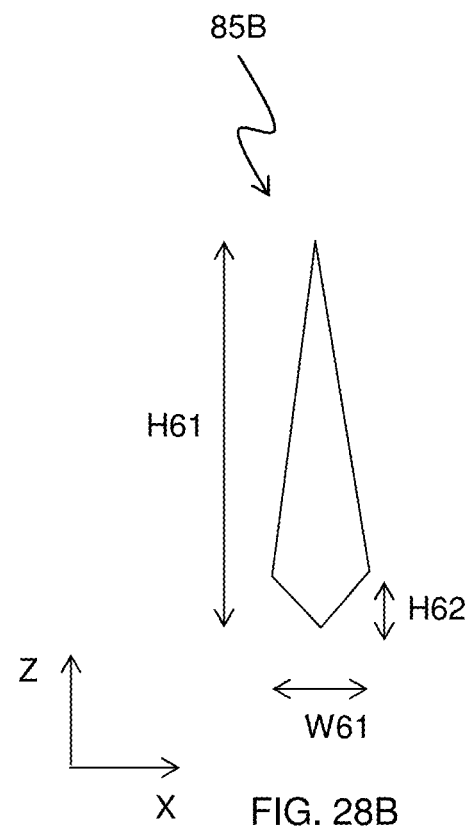

As shown in FIGS. 15A and 23, the NW GAA FETs of the present disclosure have a void 85B in certain embodiments. FIGS. 28A and 28B show exemplary cross sectional views of voids formed under the III-V semiconductor layer.

FIG. 28A shows a "keyhole" shape of the void 85B formed by six faces. The height H51 of the void 85B is in a range from about 10.0 nm to about 100 nm, and the heights H52 and H53 of the void 85B are in a range from about 1.0 nm to about 20.0 nm in some embodiments. The height H52 may be different from the height H53. The width W51 of the void 85B is in a range from about 3.0 nm to about 10.0 nm in some embodiments.

FIG. 28B shows a "teardrop" shape of the void 85B formed by four faces. The height H61 of the void 85B is in a range from about 10.0 nm to about 100 nm, and the heights H62 of the void 85B is in a range from about 1.0 nm to about 30.0 nm in some embodiments. The width W61 of the void 85B is in a range from about 3.0 nm to about 10.0 nm in some embodiments. The corners of the void 85B are rounded in some embodiments.

It will be understood that not all advantages have been necessarily discussed herein, no particular advantage is required for all embodiments or examples, and other embodiments or examples may offer different advantages.

According to some embodiments of the present disclosure, since the Group III-V (e.g., InAs) compound semiconductor layer as a channel has a "boomerang" shape or a "triangular shape" in its cross section, it is possible to obtain a higher current capacity compared with a simple bar type channel with the same foot print (i.e., the width). Further, it is also possible to increase a surface area of the channel. Further, since the dominant facets (e.g., F2 and F9 of FIG. 19 or F22 and F26 of FIG. 24) are in a (111) plane, it is beneficial for electron transportation of L-valley conductors.

In accordance with one aspect of the present disclosure, in a method of manufacturing a gate-all-around field effect transistor (GAA FET), a shallow-trench-isolation (STI) is formed in a silicon (Si) substrate such that the STI surrounds a Si region of the silicon substrate. The Si region is recessed. After the Si region is recessed, a compound semiconductor layer is formed on a surface of the recessed Si region. A Group III-V semiconductor layer is formed on the compound semiconductor layer. After the Group III-V semiconductor layer is formed, the STI is recessed so as to expose a part of the Si substrate under the Group III-V semiconductor layer. The compound semiconductor layer is removed. A gate dielectric layer and a metal gate layer are formed around the Group III-V semiconductor layer.

In accordance with another aspect of the present disclosure, in a method of manufacturing a gate-all-around field effect transistor (GAA FET), a shallow-trench-isolation (STI) in a silicon (Si) substrate is formed such that the STI surrounds a Si region of the silicon substrate. The Si region is recessed. After the Si region is recessed, a compound semiconductor layer is formed on a surface of the recessed Si region. After the compound semiconductor layer is formed, an upper portion of the compound semiconductor layer is planarized. A Group III-V semiconductor layer is formed on the planarized compound semiconductor layer. After the Group III-V semiconductor layer is formed, the STI is recessed so as to expose a part of the Si substrate under the Group III-V semiconductor layer. The compound semiconductor layer is removed. A gate dielectric layer and a metal gate layer are formed around the Group III-V semiconductor layer.

In accordance with another aspect of the present disclosure, a gate-all-around field effect transistor (GAA FET) includes an InAs nano-wire as a channel layer, a gate dielectric layer wrapping the InAs nano-wire, and a gate electrode metal layer formed on the gate dielectric layer. The InAs nano-wire has first to fourth major surfaces three convex-rounded corner surfaces and one concave-rounded corner surface.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gate-all-around field effect transistor (GAA FET), comprising:
   a nano-wire made of a Group III-V semiconductor as a channel layer;
   a gate dielectric layer wrapping the nano-wire; and
   a gate electrode metal layer formed on the gate dielectric layer, wherein:
   the nano-wire has first, second, third and fourth major faces, first, second and third convex-rounded corner faces and one concave-rounded corner face.

2. The GAA FET of claim 1, wherein the Group III-V semiconductor is InAs.

3. The GAA FET of claim 1, further comprising:
   a bottom fin structure, over which the nano-wire is disposed and which extends along a first direction,
   wherein the gate electrode metal layer extends along a second direction crossing the first direction.

4. The GAA FET of claim 3, wherein in the second direction, a width of the nano-wire covered by the gate electrode metal layer is greater than a width of the bottom fin structure.

5. The GAA FET of claim 4, wherein an upper surface of the bottom fin structure has a V-shaped concave shape.

6. The GAA FET of claim 5, wherein the width of the bottom fin structure is measured at a bottom of the V-shaped concave shape.

7. The GAA FET of claim 4, wherein the gate dielectric layer is also formed on an upper surface of the bottom fin structure.

8. The GAA FET of claim 4, further comprising a void disposed in the gate electrode metal layer between the nano-wire and the bottom fin structure.

9. The GAA FET of claim 8, further comprising a source and a drain,
   wherein the void extends below the source and the drain.

10. The GAA FET of claim 4, wherein no void is disposed in the gate electrode metal layer between the nano-wire and the bottom fin structure.

11. The GAA FET of claim 1, wherein:
    the first convex-rounded corner face connects the first major face and the second major face,
    the concave-rounded corner face connects the second major face and the third major face,
    the second convex-rounded corner face connects the third major face and the fourth major face, and
    the third convex-rounded corner face connects the fourth major face and the first major face.

12. The GAA FET of claim 1, wherein:
    extended planes of the first major face and the second major face make an acute angle,
    extended planes of the second major face and the third major face make an angle of 60° to 150°,
    extended planes of the third major face and the fourth major face make an acute angle, and
    extended planes of the fourth major face and the first major face make an acute angle.

13. The GAA FET of claim 12, wherein the extended planes of the second major face and the third major face make an angle of 90° to 150°.

14. A gate-all-around field effect transistor (GAA FET), comprising:
    a bottom fin structure extending in a first direction;
    an InAs nano-wire as a channel layer; and
    a gate electrode extending in a second direction crossing the first direction, and including a gate dielectric layer wrapping the InAs nano-wire and a gate electrode metal layer formed on the gate dielectric layer, wherein:
    the InAs nano-wire has a triangular cross section with rounded corners, and
    in the second direction, a width of the InAs nano-wire under the gate electrode is greater than a width of the bottom fin structure.

15. The GAA FET of claim 14, wherein an upper surface of the bottom fin structure has a V-shaped concave shape.

16. The GAA FET of claim 15, wherein the width of the bottom fin structure is measured at a bottom of the V-shaped concave shape.

17. The GAA FET of claim 14, wherein the gate dielectric layer is also formed on an upper surface of the bottom fin structure.

18. The GAA FET of claim 14, further comprising a void disposed in the gate electrode metal layer between the nano-wire and the bottom fin structure.

19. The GAA FET of claim 18, further comprising a source region and a drain,
wherein the void extends below the source and the drain.

20. A gate-all-around field effect transistor (GAA FET), comprising:
a bottom fin structure extending in a first direction;
an InAs nano-wire as a channel layer; and
a gate electrode extending in a second direction crossing the first direction, and including a gate dielectric layer wrapping the InAs nano-wire and a gate electrode metal layer formed on the gate dielectric layer, wherein:
the InAs nano-wire has a boomerang shape cross section, and
in the second direction, a width of the InAs nano-wire under the gate electrode is greater than a width of the bottom fin structure.

* * * * *